US012635561B2

(12) United States Patent
Kim et al.

(10) Patent No.: US 12,635,561 B2
(45) Date of Patent: May 19, 2026

(54) DISPLAY DEVICE USING MICRO LED AND MANUFACTURING METHOD THEREOF

(71) Applicant: LG ELECTRONICS INC., Seoul (KR)

(72) Inventors: Jungsub Kim, Seoul (KR); Junghoon Kim, Seoul (KR); Changseo Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 1118 days.

(21) Appl. No.: 17/621,399

(22) PCT Filed: Jul. 10, 2019

(86) PCT No.: PCT/KR2019/008467
§ 371 (c)(1),
(2) Date: Sep. 30, 2022

(87) PCT Pub. No.: WO2021/006385
PCT Pub. Date: Jan. 14, 2021

(65) Prior Publication Data
US 2023/0014515 A1     Jan. 19, 2023

(30) Foreign Application Priority Data

Jul. 9, 2019     (KR) ........................ 10-2019-0082779

(51) Int. Cl.
*H01L 25/075*     (2006.01)
*H10H 20/01*     (2025.01)
(Continued)

(52) U.S. Cl.
CPC ....... *H01L 25/0753* (2013.01); *H10H 20/018* (2025.01); *H10H 20/831* (2025.01); *H10H 20/032* (2025.01); *H10H 20/825* (2025.01)

(58) Field of Classification Search
CPC ......................... H01L 25/0753; H10H 20/018; H10H 20/032; H10H 20/825; H10H 20/83; H10H 20/831; H10H 20/84; H10H 20/857
See application file for complete search history.

(56) References Cited

U.S. PATENT DOCUMENTS 10,573,544 B1 *   2/2020  Radauscher ............ H01L 22/20
2011/0284822 A1   11/2011  Jung et al.
2018/0175268 A1 *  6/2018  Moon ................. H01L 25/0753

FOREIGN PATENT DOCUMENTS

CN          1517771      8/2004
CN        102881811      1/2013
(Continued)

OTHER PUBLICATIONS

The State Intellectual Property Office of the People's Republic of China Application Serial No. 201980098292.8, Notice of Allowance dated Apr. 18, 2025, 8 pages.
(Continued)

*Primary Examiner* — Matthew C Landau
*Assistant Examiner* — Dmitriy Yemelyanov
(74) *Attorney, Agent, or Firm* — LEE, HONG, DEGERMAN, KANG & WAIMEY

(57)     ABSTRACT
The present specification provides a micro LED display device which minimizes a short-circuit fault by using a semiconductor light emitting element including multiple passivation layers formed therein, and a manufacturing method thereof. In a display device using a plurality of semiconductor light emitting elements according to one embodiment of the present invention, at least one of the semiconductor light emitting elements comprises: a first conductive semiconductor layer; a second conductive semiconductor layer; an active layer; a first conductive electrode; a second conductive electrode; and a first passivation layer and a second passivation layer successively disposed to
(Continued)

surround the lateral surfaces of the first conductive semiconductor layer and the second conductive semiconductor layer, wherein the second passivation layer is positioned in a region excluding parts in contact with a first electrode and a second electrode, on the first conductive electrode and the second conductive electrode.

4 Claims, 25 Drawing Sheets

(51) Int. Cl.
H10H 20/825 (2025.01)
H10H 20/831 (2025.01)

(56) References Cited

FOREIGN PATENT DOCUMENTS

| | | |
|---|---|---|
| CN | 104037278 | 9/2014 |
| EP | 2546894 | 1/2013 |
| JP | 2009-111099 | 5/2009 |
| KR | 10-2013-0008478 | 1/2013 |
| KR | 1020180114439 | 10/2018 |
| KR | 10-2019-0030057 | 3/2019 |
| KR | 1020190042130 | 4/2019 |
| KR | 10-2019-0073133 | 6/2019 |
| KR | 11020190067296 | 6/2019 |
| KR | 1020190076929 | 7/2019 |
| KR | 1020190077254 | 7/2019 |

OTHER PUBLICATIONS

The State Intellectual Property Office of the People's Republic of China Application Serial No. 201980098292.8, Office Action dated Nov. 1, 2024, 22 pages.
Korean Intellectual Property Office Application No. 10-2019-0082779, Office Action dated Dec. 29, 2023, 6 pages.
PCT International Application No. PCT/KR2019/008467, International Search Report dated Apr. 9, 2020, 10 pages.

* cited by examiner

FORM SEMICONDUCTOR LIGHT EMITTING STRUCTURE ON FIRST SUBSTRATE — S1010

FORM MULTI-PASSIVATION LAYER — S1020

SEPARATE SEMICONDUCTOR LIGHT-EMITTING ELEMENT FROM FIRST SUBSTRATE — S1030

ASSEMBLE SEMICONDUCTOR LIGHT-EMITTING ELEMENT ONTO SECOND SUBSTRATE — S1040

WIRING PROCESS — S1050

FORM FIRST PASSIVATION LAYER ON SEMICONDUCTOR LIGHT EMITTING STRUCTURE — S1021

REMOVE FIRST PASSIVATION LAYER IN CONDUCTIVITY TYPE ELECTRODE REGION — S1022

FORM SECOND PASSIVATION LAYER — S1023

DISPLAY DEVICE USING MICRO LED AND MANUFACTURING METHOD THEREOF

CROSS-REFERENCE TO RELATED APPLICATIONS

This application is the National Stage filing under 35 U.S.C. 371 of International Application No. PCT/KR2019/008467, filed on Jul. 10, 2019, which claims the benefit of earlier filing date and right of priority to Korean Application No. 10-2019-0082779, filed on Jul. 9, 2019, the contents of which are all hereby incorporated by reference herein their entirety.

TECHNICAL FIELD

The present disclosure is applicable to a display device-related technical field, and relates, for example, to a display device using a micro LED (light emitting diode) and a method for manufacturing the same.

BACKGROUND ART

Recently, in a field of a display technology, display devices having excellent characteristics such as thinness, flexibility, and the like have been developed. On the other hand, currently commercialized major displays are represented by a LCD (liquid crystal display) and an OLED (organic light emitting diode).

However, the LCD has a response time that is not fast, and is difficult to be flexibly implemented.

On the other hand, LED (light emitting diode), which is a well-known semiconductor light-emitting element that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light-emitting element may be proposed. Such light emitting diode has various advantages, such as long lifespan, low power consumption, excellent initial driving characteristics, high vibration resistance, and the like, compared to a filament-based light-emitting element.

A size of such semiconductor light-emitting element has recently been reduced to tens of micrometers. Therefore, when implementing the display device using the semiconductor light-emitting elements, a very large number of semiconductor light-emitting elements must be assembled on a wiring substrate of the display device.

However, during the assembly process, it is very difficult to precisely position a number of semiconductor light-emitting elements at desired positions on the wiring substrate, and a semiconductor light-emitting element that is not assembled at the specific position causes various defects in a subsequent wiring process.

DISCLOSURE

Technical Problem

An object of an embodiment of the present disclosure is to provide a display device and a method for manufacturing the same using a semiconductor light-emitting element.

Another object of an embodiment of the present disclosure is to provide a display device in which a stable wiring process is possible after assembling a semiconductor light-emitting element on a display substrate, and a method for manufacturing the same.

Furthermore, a purpose of another embodiment of the present disclosure is to solve various problems not mentioned herein. Those skilled in the art may understand it through the full text of the specification and drawings.

Technical Solutions

A method for manufacturing a display device using a semiconductor light-emitting element for achieving the above purpose includes forming the semiconductor light-emitting element on a first substrate, transferring the semiconductor light-emitting element to a second substrate, coating an insulating layer on the semiconductor light-emitting element transferred to the second substrate, and forming a wiring electrode electrically connected to the semiconductor light-emitting element, and the forming of the semiconductor light-emitting element includes forming a semiconductor light emitting structure including a first conductivity type semiconductor layer, an active layer, a second conductivity type semiconductor layer, a first conductivity type electrode, and a second conductivity type electrode on the first substrate, forming a first passivation layer on the semiconductor light emitting structure, selectively removing portions of the first passivation layer formed on top of the first conductivity type electrode and the second conductivity type electrode of the semiconductor light emitting structure, and forming a second passivation layer on the semiconductor light emitting structure.

As an embodiment, the method further includes removing the second passivation layer between the transferring of the semiconductor light-emitting element to the second substrate and the coating of the insulating layer.

As an embodiment, the removing of the second passivation layer is performed by a wet etching process.

As an embodiment, the coating of the insulating layer includes planarizing an upper portion of the insulating layer, and exposing at least some regions of a top surface of the semiconductor light-emitting element.

As an embodiment, the forming of the wiring electrode includes forming a first electrode electrically connected to the first conductivity type electrode of the semiconductor light-emitting element and a second electrode electrically connected to the second conductivity type electrode.

As an embodiment, the forming of the first electrode and the second electrode includes removing portions of the second passivation layer formed on top of the first conductivity type electrode and the second conductivity type electrode.

As an embodiment, the forming of the first electrode and the second electrode includes selectively removing a portion of the second passivation layer located in an overlapping region between each of the first electrode and the second electrode and each of the first conductivity type electrode and the second conductivity type electrode.

As an embodiment, the selectively removing of the second passivation layer is performed by a dry etching process.

In a display device including a plurality of semiconductor light-emitting elements according to another embodiment of the present disclosure, at least one of the semiconductor light-emitting elements includes a first conductivity type semiconductor layer, a second conductivity type semiconductor layer positioned above the first conductivity type semiconductor layer, an active layer disposed between the first conductivity type semiconductor layer and the second conductivity type semiconductor layer, a second conductivity type electrode positioned on the second conductivity type semiconductor layer, a first conductivity type electrode positioned in a region where portions of the second conductivity type semiconductor layer and the active layer are etched and the first conductivity type semiconductor layer is exposed, and a first passivation layer and a second passivation layer sequentially disposed to surround side surfaces of the first conductivity type semiconductor layer and the second conductivity type semiconductor layer, the second passivation layer is positioned in a region except for a portion in contact with the first electrode of a top surface of the first conductivity type electrode, and the second passivation layer is positioned in a region except for a portion in contact with the second electrode of a top surface of the second conductivity type electrode.

As an embodiment, the first passivation layer and the second passivation layer are sequentially disposed in a region except for a portion in contact with the first conductivity type electrode of a top surface of the first conductivity type semiconductor layer, and the first passivation layer and the second passivation layer are sequentially disposed in a region except for a portion in contact with the first conductivity type electrode of a top surface of the second conductivity type semiconductor layer.

As an embodiment, the second passivation layer is positioned in a region except for a portion in contact with the first conductivity type electrode of a top surface of the first conductivity type semiconductor layer, and the second passivation layer is positioned in a region except for a portion in contact with the first conductivity type electrode of a top surface of the second conductivity type semiconductor layer.

As an embodiment, a first etching ratio of the first passivation layer is smaller than a second etching ratio of the second passivation layer.

As an embodiment, the first passivation layer contains the same material as the second passivation layer.

As an embodiment, a thickness of the second passivation layer is 100 nm or more smaller than a thickness of the first passivation layer.

As an embodiment, a magnetic layer is included beneath the first conductivity type electrode or the second conductivity type electrode.

As an embodiment, the semiconductor light-emitting element is an LED (a micro-LED) having a size on the order of micrometers.

Advantageous Effects

According to one embodiment of the present disclosure, it is possible to provide a display device and a method for manufacturing the same using a semiconductor light-emitting element.

Specifically, when the wiring process is performed after assembling the semiconductor light-emitting element onto the substrate, the passivation layer may be selectively removed only in the portion to which the wiring electrode is connected by the multi-passivation layer formed on the semiconductor light-emitting element, so that it is possible to perform the stable wiring process that minimizes the risk of the short defect.

Accordingly, there is a technical effect of reducing the short or open defects of the semiconductor light-emitting element that may occur in the wiring process.

Furthermore, according to another embodiment of the present disclosure, there are additional effects not mentioned herein. Those of ordinary skill in the art may understand it through the full text of the specification and drawings.

DESCRIPTION OF DRAWINGS

FIGS. 3A and 3B are cross-sectional diagrams taken along the cutting lines B-B and C-C in FIG. 2;

FIG. 7 is a perspective diagram of a display device using a semiconductor light-emitting element according to another embodiment of the present disclosure;

FIG. 8 is a cross-sectional diagram taken along a cutting line D-D shown in FIG. 8;

FIG. 22 is a view showing a case in which a wiring electrode is formed at various positions in a semiconductor light-emitting element performing a wiring process of FIG. 17.

BEST MODE

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light-emitting element mentioned in this specification is a concept including an LED, a micro LED, and the like.

Figure 1:
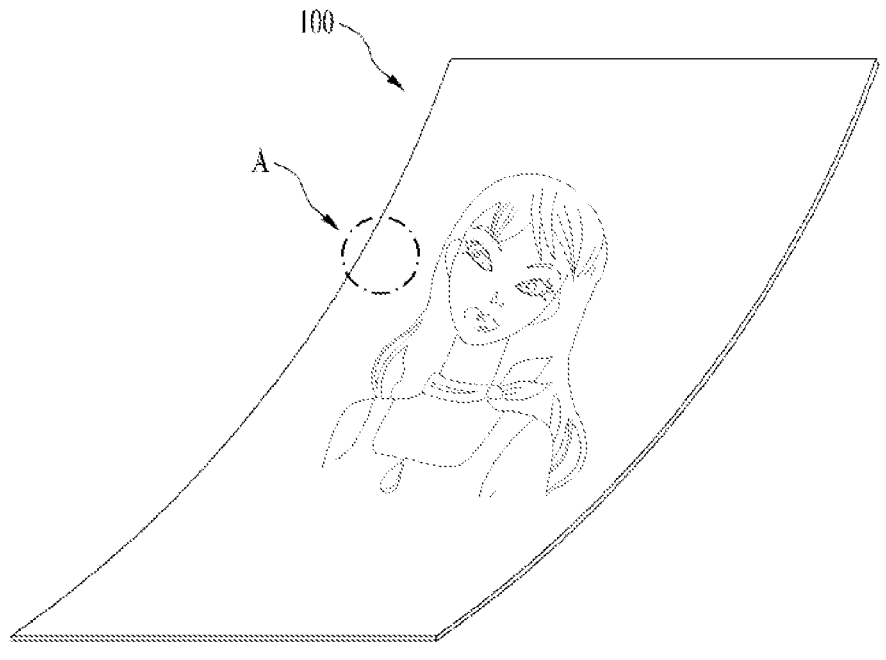
FIG. 1 is a conceptual diagram illustrating an embodiment of a display device using a semiconductor light-emitting element according to the present disclosure.

FIG. 1 is a conceptual view illustrating an embodiment of a display device using a semiconductor light-emitting element according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first state is changed to a bent state (e.g., a state having a finite radius of curvature) (hereinafter referred to as a second state) by external force, the display area may be a curved surface.

As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light-emitting element. In the present disclosure, a light emitting diode (LED) is exemplified as a type of the semiconductor light-emitting element configured to convert electric current into light. The LED may be formed in a small size, and may thus serve as a unit pixel even in the second state.

Hereinafter, a flexible display implemented using the LED will be described in more detail with reference to the drawings.

Figure 2:
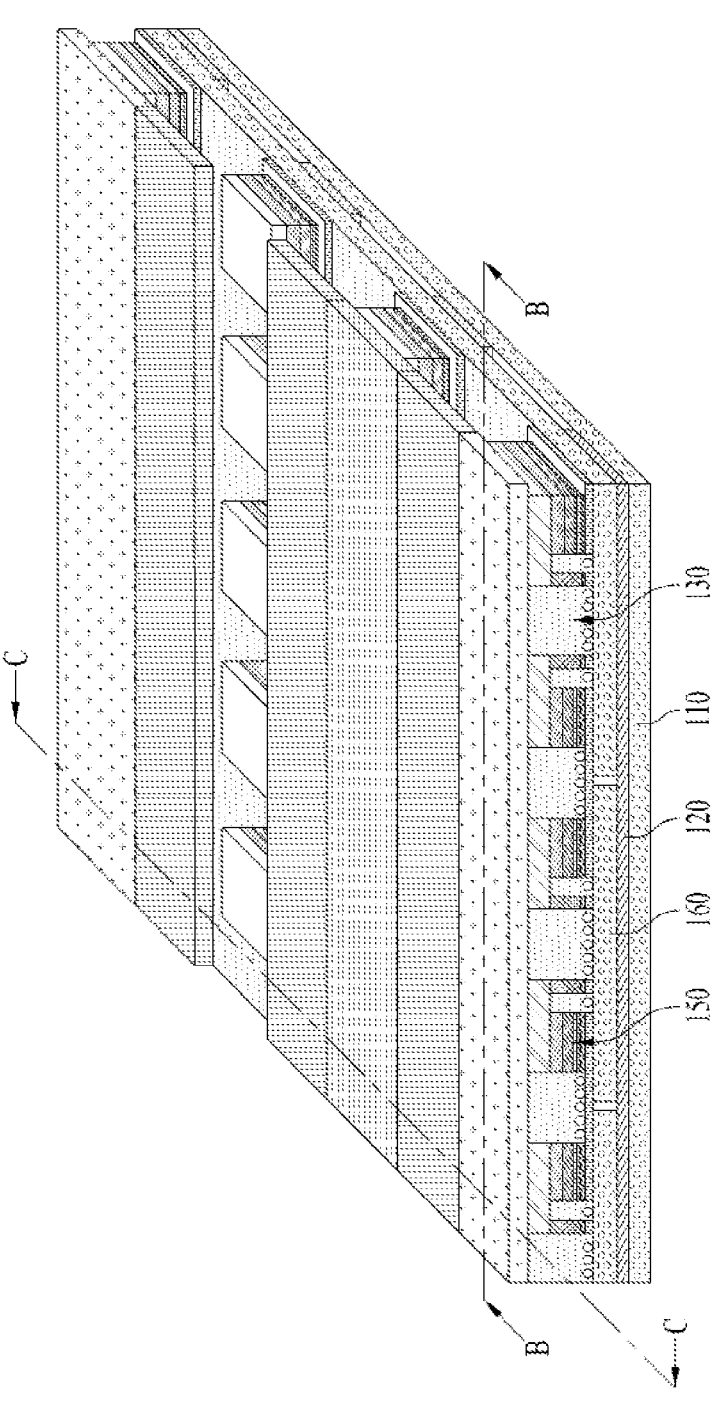
FIG. 2 is a partially enlarged diagram showing a part A shown in FIG. 1.

FIG. 2 is a partially enlarged view showing part A of FIG. 1.

Figure 3A:
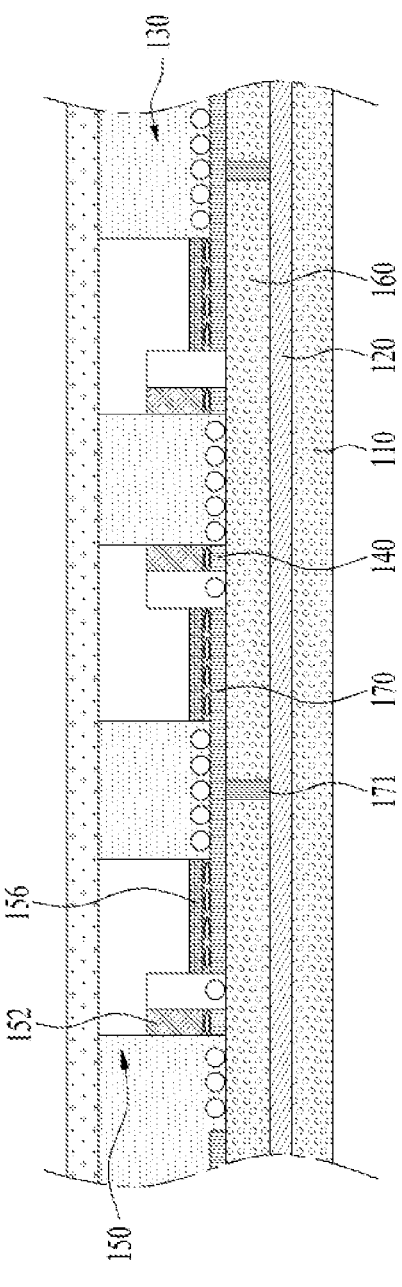
Figure 3B:
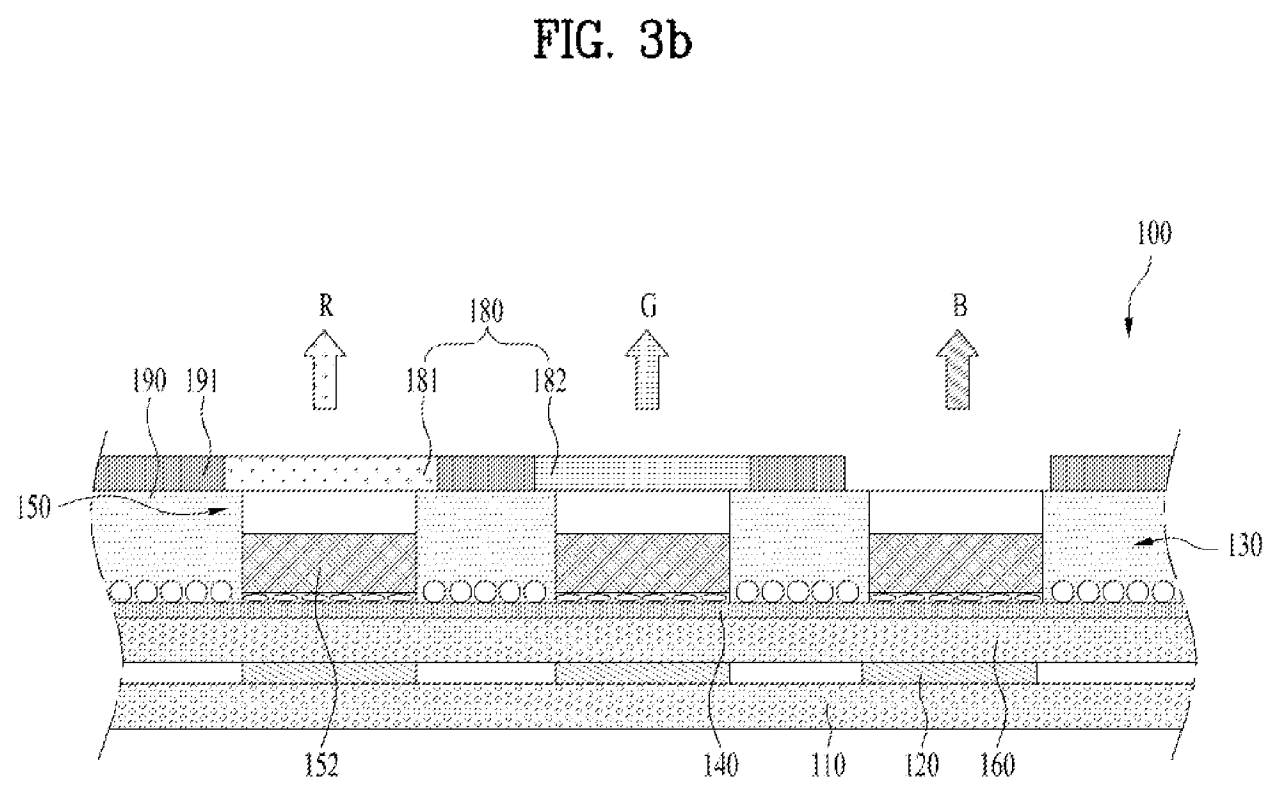

FIGS. 3A and 3B are cross-sectional views taken along lines B-B and C-C in FIG. 2.

Figure 4:
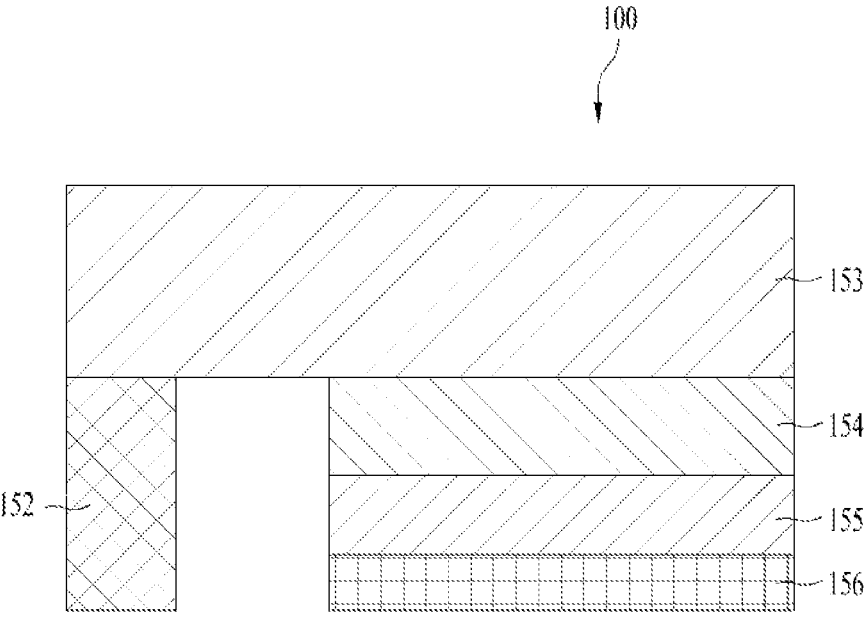
FIG. 4 is a conceptual diagram illustrating the flip-chip type semiconductor light-emitting element of FIG. 3.

FIG. 4 is a conceptual view illustrating the flip-chip type semiconductor light-emitting element of FIG. 3.

Figure 5A:
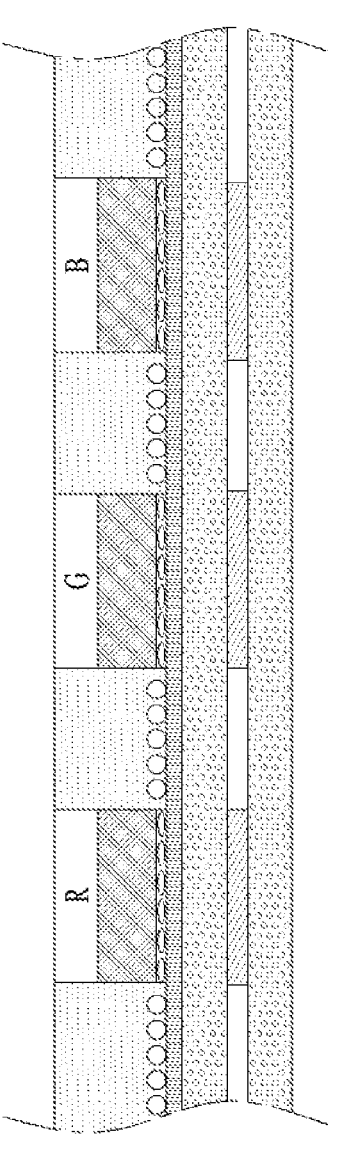
FIGS. 5A to 5C are conceptual diagrams illustrating various examples of color implementation with respect to a flip-chip type semiconductor light-emitting element.
Figure 5B:
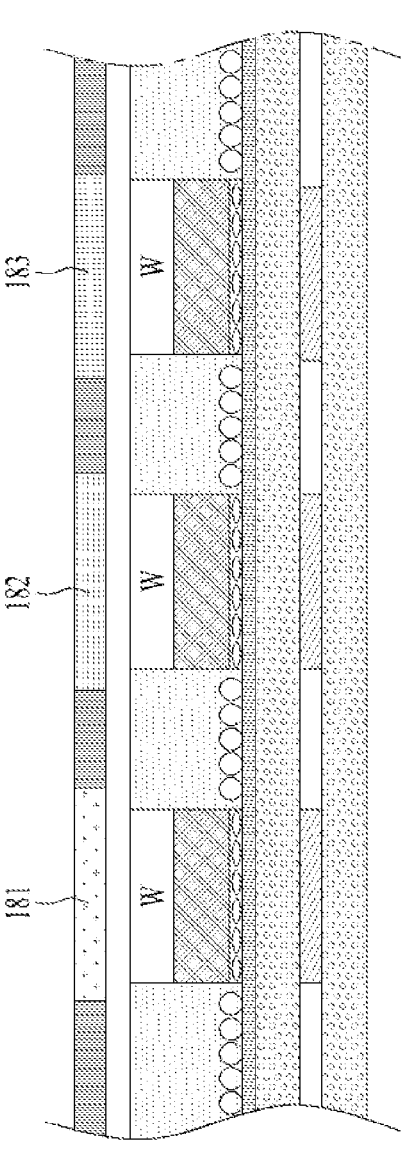
Figure 5C:
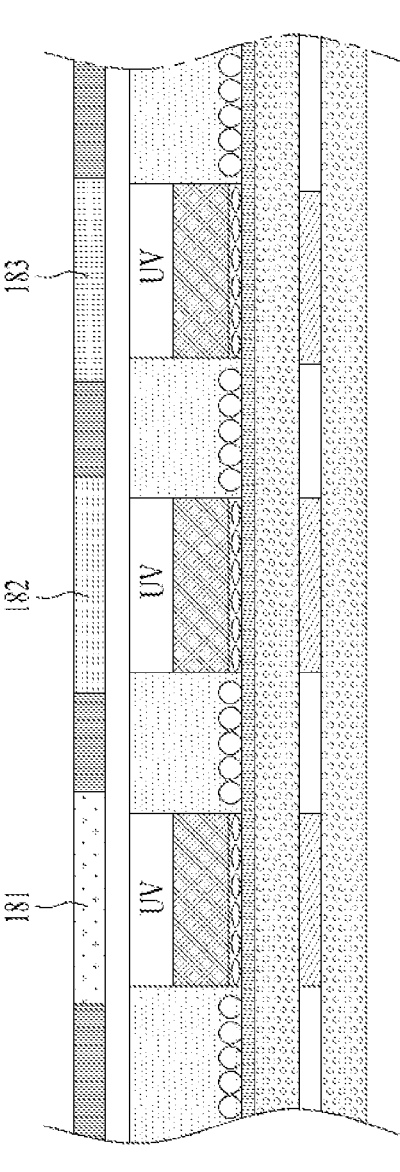

FIGS. 5A to 5C are conceptual views illustrating various examples of implementation of colors in relation to a flip-chip type semiconductor light-emitting element.

As shown in FIGS. 2, 3A and 3B, the display device 100 using a passive matrix (PM) type semiconductor light-emitting element is exemplified as the display device 100 using a semiconductor light-emitting element. However, the examples described below are also applicable to an active matrix (AM) type semiconductor light-emitting element.

The display device 100 shown in FIG. 1 may include a substrate 110, a first electrode 120, a conductive adhesive layer 130, a second electrode 140, and at least one semiconductor light-emitting element 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light-emitting element 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light-emitting element 150 is connected thereto in a flip-chip form by applying heat and pressure. Thereby, the semiconductor light-emitting element 150 is electrically connected to the first electrode 120 and the second electrode 140.

Referring to FIG. 4, the semiconductor light-emitting element may be a flip-chip type light-emitting element.

For example, the semiconductor light-emitting element may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light-emitting elements 150. For example, p-type electrodes of semiconductor light-emitting elements on left and right sides of an auxiliary electrode may be electrically connected to one auxiliary electrode.

More specifically, the semiconductor light-emitting element 150 may be press-fitted into the conductive adhesive layer 130 by heat and pressure. Thereby, only the portions of the semiconductor light-emitting element 150 between the p-type electrode 156 and the auxiliary electrode 170 and between the n-type electrode 152 and the second electrode 140 may exhibit conductivity, and the other portions of the semiconductor light-emitting element 150 do not exhibit conductivity as they are not press-fitted. In this way, the conductive adhesive layer 130 interconnects and electrically connects the semiconductor light-emitting element 150 and the auxiliary electrode 170 and interconnects and electrically connects the semiconductor light-emitting element 150 and the second electrode 140.

The plurality of semiconductor light-emitting elements 150 may constitute a light-emitting element array, and a phosphor conversion layer 180 may be formed on the light-emitting element array.

The light-emitting element array may include a plurality of semiconductor light-emitting elements having different luminance values. Each semiconductor light-emitting element 150 may constitute a unit pixel and may be electrically connected to the first electrode 120. For example, a plurality of first electrodes 120 may be provided, and the semiconductor light-emitting elements may be arranged in, for example, several columns. The semiconductor light-emitting elements in each column may be electrically connected to any one of the plurality of first electrodes.

In addition, since the semiconductor light-emitting elements are connected in a flip-chip form, semiconductor light-emitting elements grown on a transparent dielectric substrate may be used. The semiconductor light-emitting elements may be, for example, nitride semiconductor light-emitting elements. Since the semiconductor light-emitting element 150 has excellent luminance, it may constitute an individual unit pixel even when it has a small size.

As shown in FIG. 3, a partition wall 190 may be formed between the semiconductor light-emitting elements 150. In this case, the partition wall 190 may serve to separate individual unit pixels from each other, and may be integrated with the conductive adhesive layer 130. For example, by inserting the semiconductor light-emitting element 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the semiconductor light-emitting element 150. For example, the semiconductor light-emitting element 150 may be a blue semiconductor light-emitting element that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue semiconductor light-emitting element at a position of a unit pixel of red color, and the green phosphor 182 capable of converting blue light into green (G) light may be laminated on the blue semiconductor light-emitting element at a position of a unit pixel of green color. Only the blue semiconductor light-emitting element may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light-emitting element 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Referring to FIG. 5A, each semiconductor light-emitting element may be implemented as a high-power light-emitting element emitting light of various colors including blue by using gallium nitride (GaN) as a main material and adding indium (In) and/or aluminum (Al).

In this case, each semiconductor light-emitting element may be a red, green, or blue semiconductor light-emitting element to form a unit pixel (sub-pixel). For example, red, green, and blue semiconductor light-emitting elements R, G, and B may be alternately disposed, and unit pixels of red, green, and blue may constitute one pixel by the red, green and blue semiconductor light-emitting elements. Thereby, a full-color display may be implemented.

Referring to FIG. 5B, the semiconductor light-emitting element 150*a* may include a white light-emitting element W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light-emitting element W. In addition, a unit pixel may be formed using a color filter repeating red, green, and blue on the white light-emitting element W.

Referring to FIG. 5C, a red phosphor conversion layer 181, a green phosphor conversion layer 185, and a blue phosphor conversion layer 183 may be provided on a ultraviolet light-emitting element. Not only visible light but also ultraviolet (UV) light may be used in the entire region of the semiconductor light-emitting element. In an embodiment, UV may be used as an excitation source of the upper phosphor in the semiconductor light-emitting element.

Referring back to this example, the semiconductor light-emitting element is positioned on the conductive adhesive layer to constitute a unit pixel in the display device. Since the semiconductor light-emitting element has excellent luminance, individual unit pixels may be configured despite even when the semiconductor light-emitting element has a small size.

Regarding the size of such an individual semiconductor light-emitting element, the length of each side of the device may be, for example, 80 μm or less, and the device may have a rectangular or square shape. When the semiconductor light-emitting element has a rectangular shape, the size thereof may be less than or equal to 20 μm×80 μm.

In addition, even when a square semiconductor light-emitting element having a side length of 10 μm is used as a unit pixel, sufficient brightness to form a display device may be obtained.

Therefore, for example, in case of a rectangular pixel having a unit pixel size of 600 μm×300 μm (i.e., one side by the other side), a distance of a semiconductor light-emitting element becomes sufficiently long relatively.

Thus, in this case, it is able to implement a flexible display device having high image quality over HD image quality.

The above-described display device using the semiconductor light-emitting element may be prepared by a new fabricating method. Such a fabricating method will be described with reference to FIG. 6 as follows.

Figure 6:
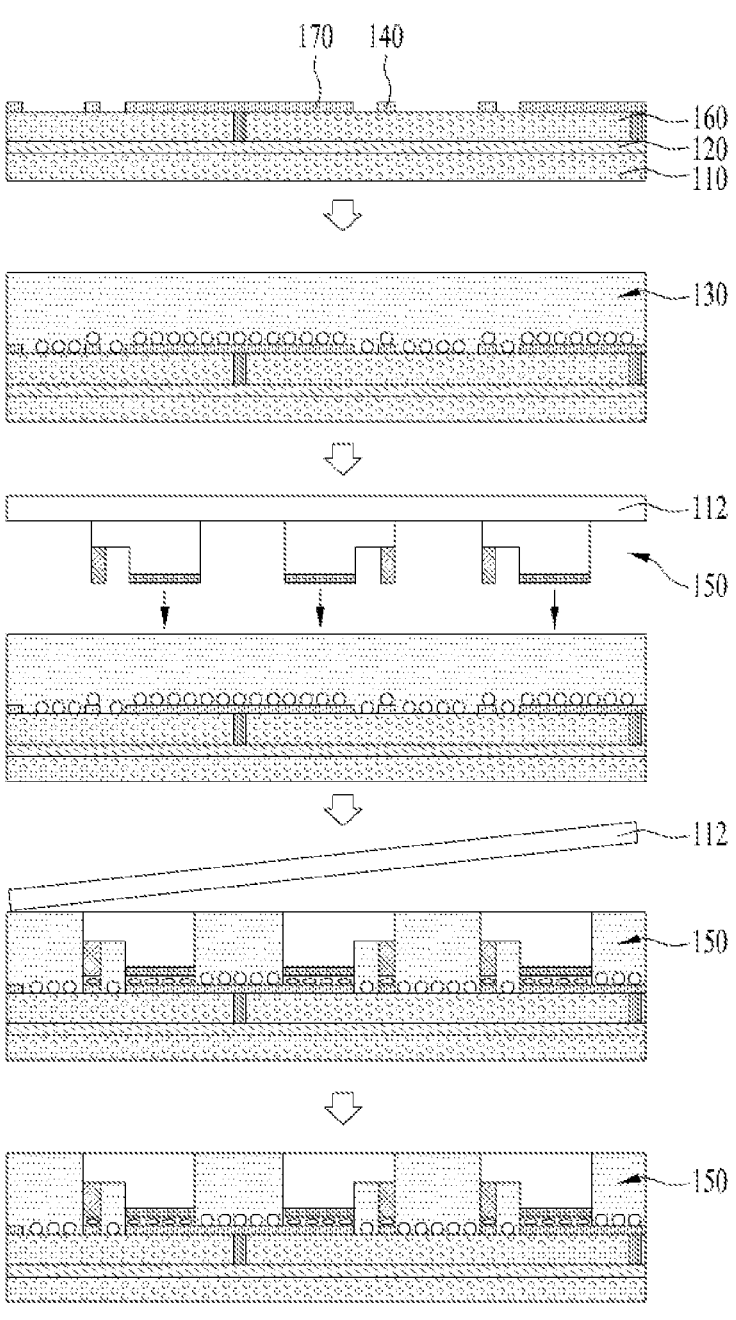
FIG. 6 shows cross-sectional views of a method of fabricating a display device using a semiconductor light-emitting element according to the present disclosure.

FIG. 6 shows cross-sectional views of a method of fabricating a display device using a semiconductor light-emitting element according to the present disclosure.

Referring to FIG. 6, first of all, a conductive adhesive layer 130 is formed on an insulating layer 160 located between an auxiliary electrode 170 and a second electrode 140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light-emitting elements 150 configuring individual pixels are located to correspond to locations of the auxiliary electrode 170 and the second electrodes 140, is disposed in a manner that the semiconductor light-emitting element 150 confronts the auxiliary electrode 170 and the second electrode 140.

In this regard, the temporary 112 substrate 112 is a growing substrate for growing the semiconductor light-emitting element 150 and may include a sapphire or silicon substrate.

The semiconductor light-emitting element is configured to have a space and size for configuring a display device when formed in unit of wafer, thereby being effectively used for the display device.

Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light-emitting element 150, the auxiliary electrode 170 and the second electrode 140 has conductivity, via which the electrodes and the semiconductor light-emitting element 150 may be connected electrically. In this case, the semiconductor light-emitting element 150 is inserted into the anisotropic conductive film, by which a partition may be formed between the semiconductor light-emitting elements 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light-emitting elements 150 exposed externally. If necessary, the wiring substrate 110 to which the semiconductor light-emitting elements 150 are coupled may be coated with silicon oxide (SiOx) or the like to form a transparent insulating layer (not shown).

In addition, a step of forming a phosphor layer on one side of the semiconductor light-emitting element 150 may be further included. For example, the semiconductor light-emitting element 150 may include a blue semiconductor light-emitting element emitting Blue (B) light, and a red or green phosphor for converting the blue (B) light into a color of a unit pixel may form a layer on one side of the blue semiconductor light-emitting element.

The above-described fabricating method or structure of the display device using the semiconductor light-emitting element may be modified into various forms. For example, the above-described display device may employ a vertical semiconductor light-emitting element.

Furthermore, a modification or embodiment described in the following may use the same or similar reference numbers for the same or similar configurations of the former example and the former description may apply thereto.

Figure 7:
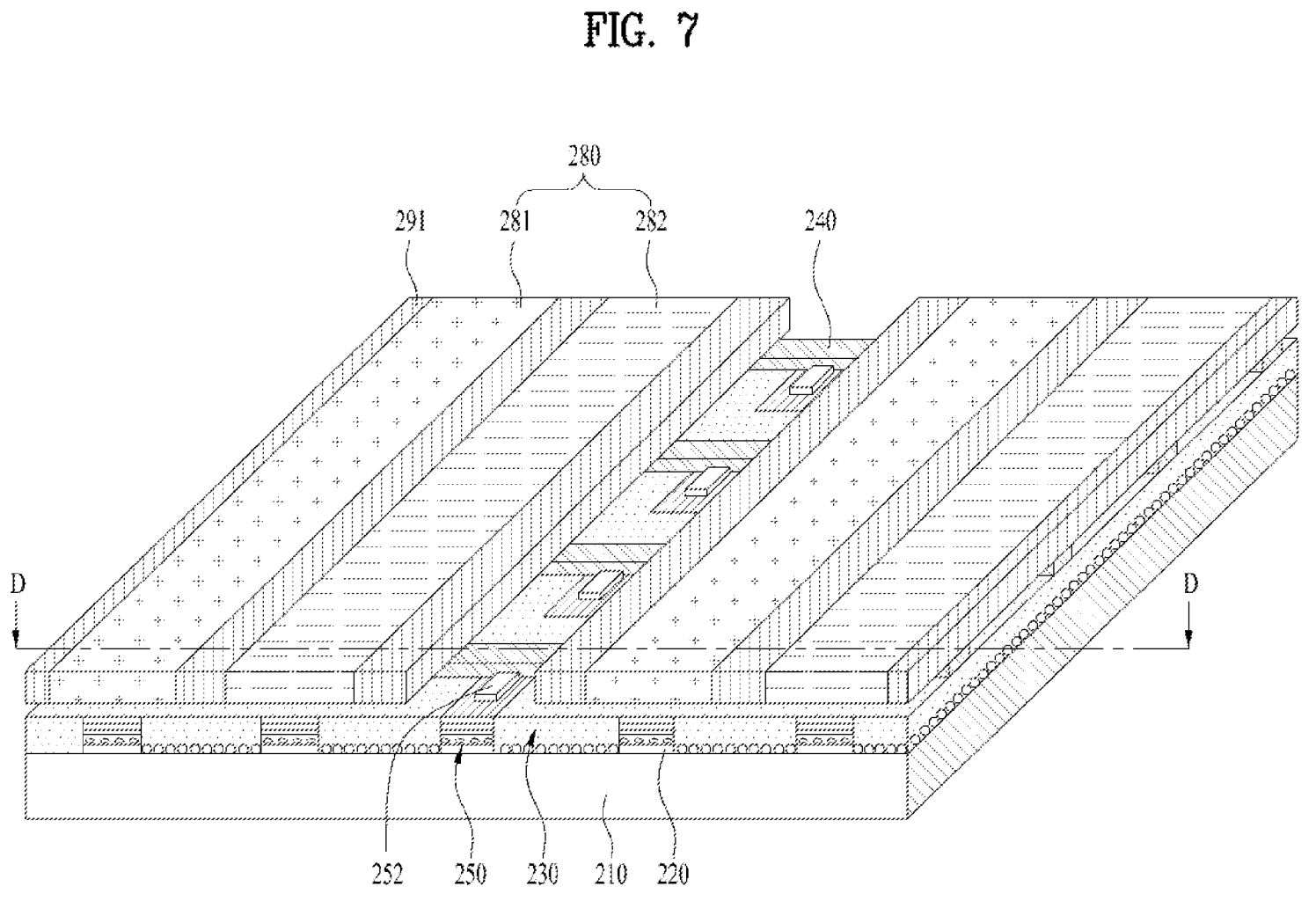
Figure 8:
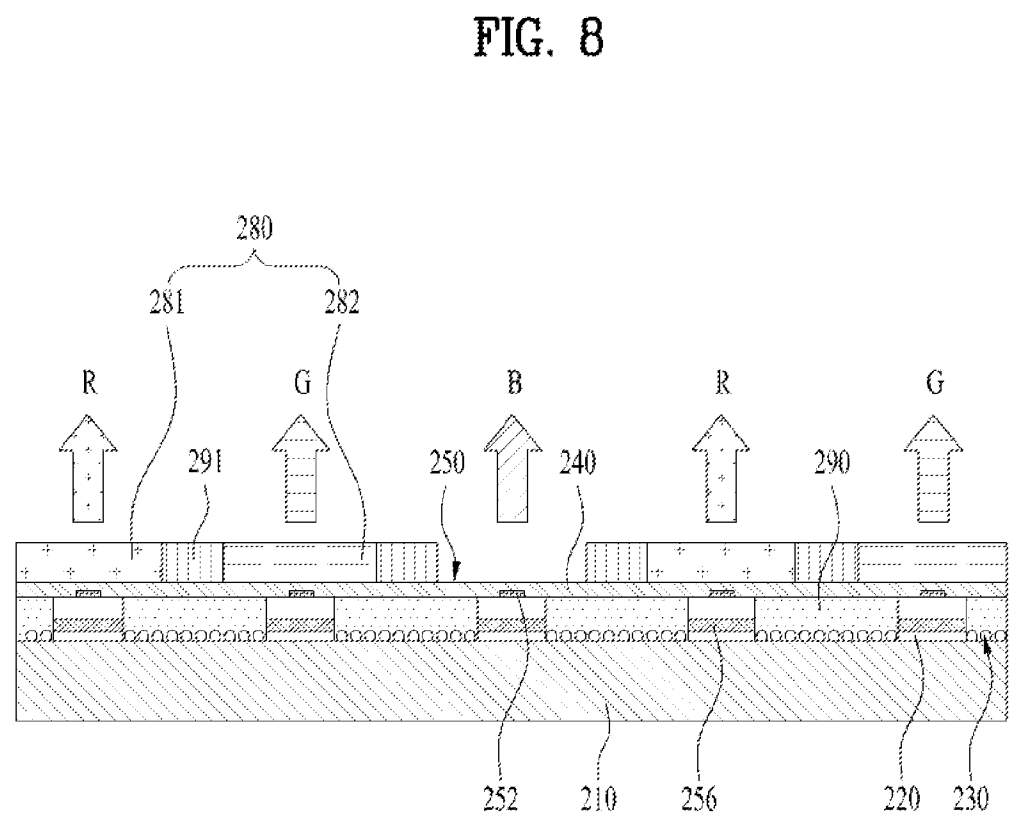
Figure 9:
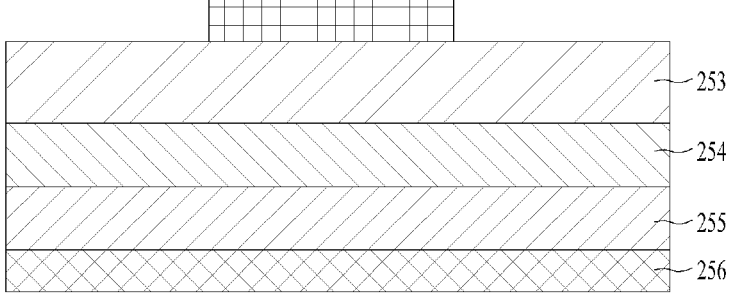
FIG. 9 is a conceptual diagram showing a vertical type semiconductor light-emitting element shown in FIG. 8.

FIG. 7 is a perspective diagram of a display device using a semiconductor light-emitting element according to another embodiment of the present disclosure, FIG. 8 is a cross-sectional diagram taken along a cutting line D-D shown in FIG. 8, and FIG. 9 is a conceptual diagram showing a vertical type semiconductor light-emitting element shown in FIG. 8.

Referring to the present drawings, a display device may employ a vertical semiconductor light-emitting element of a Passive Matrix (PM) type.

The display device includes a substrate 210, a first electrode 220, a conductive adhesive layer 230, a second electrode 240 and at least one semiconductor light-emitting element 250.

The substrate 210 is a wiring substrate on which the first electrode 220 is disposed and may contain polyimide (PI) to implement a flexible display device. Besides, the substrate 210 may use any substance that is insulating and flexible.

The first electrode 210 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light-emitting element of a flip chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light-emitting element 250 is connected by applying heat and pressure thereto, the semiconductor light-emitting element 250 is electrically connected to the first electrode 220. In doing so, the semiconductor light-emitting element 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light-emitting element 250 and the first electrode 220 as well as mechanical connection.

Thus, the semiconductor light-emitting element 250 is located on the conductive adhesive layer 230, via which an individual pixel is configured in the display device. As the semiconductor light-emitting element 250 has excellent luminance, an individual unit pixel may be configured in small size as well. Regarding a size of the individual semiconductor light-emitting element 250, a length of one side may be equal to or smaller than 80 μm for example and the individual semiconductor light-emitting element 250 may include a rectangular or square element. For example, the rectangular element may have a size equal to or smaller than 20 μm×80 μm.

The semiconductor light-emitting element 250 may have a vertical structure.

Among the vertical type semiconductor light-emitting elements, a plurality of second electrodes 240 respectively and electrically connected to the vertical type semiconductor light-emitting elements 250 are located in a manner of being disposed in a direction crossing with a length direction of the first electrode 220.

Referring to FIG. 9, the vertical type semiconductor light-emitting element 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240 described later. Since such a vertical type semiconductor light-emitting element 250 can dispose the electrodes at top and bottom, it is considerably advantageous in reducing a chip size.

Referring to FIG. 8 again, a phosphor layer 280 may formed on one side of the semiconductor light-emitting element 250. For example, the semiconductor light-emitting element 250 may include a blue semiconductor light-emitting element 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light-emitting element. At a location of configuring a green unit pixel, the green phosphor 282 capable of converting blue light into green (G) light may be stacked on the blue semiconductor light-emitting element. Moreover, the blue semiconductor light-emitting element may be singly usable for a portion that configures a blue unit pixel. In this case, the unit pixels of red (R), green (G) and blue (B) may configure a single pixel.

Yet, the present disclosure is non-limited by the above description. In a display device to which a light emitting element of a flip chip type is applied, as described above, a different structure for implementing blue, red and green may be applicable.

Regarding the present embodiment again, the second electrode 240 is located between the semiconductor light-emitting elements 250 and connected to the semiconductor light-emitting elements 250 electrically. For example, the semiconductor light-emitting elements 250 are disposed in a plurality of columns, and the second electrode 240 may be located between the columns of the semiconductor light-emitting elements 250.

Since a distance between the semiconductor light-emitting elements 250 configuring the individual pixel is sufficiently long, the second electrode 240 may be located between the semiconductor light-emitting elements 250.

The second electrode 240 may be formed as an electrode of a bar type that is long in one direction and disposed in a direction vertical to the first electrode.

In addition, the second electrode 240 and the semiconductor light-emitting element 250 may be electrically connected to each other by a connecting electrode protruding from the second electrode 240. Particularly, the connecting electrode may include a n-type electrode of the semiconductor light-emitting element 250. For example, the n-type electrode is formed as an ohmic electrode for ohmic contact, and the second electrode covers at least one portion of the ohmic electrode by printing or deposition. Thus, the second electrode 240 and the n-type electrode of the semiconductor light-emitting element 250 may be electrically connected to each other.

Referring to FIG. 8 again, the second electrode 240 may be located on the conductive adhesive layer 230. In some cases, a transparent insulating layer (not shown) containing silicon oxide (SiOx) and the like may be formed on the substrate 210 having the semiconductor light-emitting element 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240 on the semiconductor light-emitting element 250, there is a problem that ITO substance has poor adhesiveness to an n-type semiconductor layer. Therefore, according to the present disclosure, as the second electrode 240 is placed between the semiconductor light-emitting elements 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light-emitting elements 250. Namely, in order to isolate the semiconductor light-emitting element 250 configuring the individual pixel, the partition 290 may be disposed between the vertical type semiconductor light-emitting elements 250. In this case, the partition 290 may play a role in separating the individual unit pixels from each other and be formed with the conductive adhesive layer 230 as an integral part. For example, by inserting the semiconductor light-emitting element 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator depending on the purpose of the display device.

In case that the second electrode 240 is located right onto the conductive adhesive layer 230 between the semiconductor light-emitting elements 250, the partition 290 may be located between the vertical type semiconductor light-emitting element 250 and the second electrode 240 each. Therefore, an individual unit pixel may be configured using the semiconductor light-emitting element 250. Since a distance between the semiconductor light-emitting elements 250 is sufficiently long, the second electrode 240 can be placed between the semiconductor light-emitting elements 250.

And, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

As described above, in the case of the large-screen high-pixel display device using the semiconductor light-emitting element, the semiconductor light-emitting element grown on a growing substrate must be assembled or transferred onto a new substrate. The growing substrate may be, for example, a 12-inch wafer in the current state of the art, and thus a plurality of transfers may be repeated.

The assembly or transfer process is, for example, a process in which a very large number of semiconductor light-emitting elements are collectively arranged on the new substrate. The semiconductor light-emitting elements may be arranged at positions different from positions set in the arrangement process, so that there is an arrangement error.

In addition, after the assembly or the transfer, a wiring process for electrically connecting the semiconductor light-emitting element is performed. When a range of the arrangement error exceeds a certain specification range, the semiconductor light-emitting element causes a short or an open defect.

Experimentally, the arrangement error range should be managed up to a level of ±3 μm, which is the most important key factor in a production yield of a display panel.

However, in reality, managing the arrangement error is a factor that increases a manufacturing cost, such as additional management equipment and time. Another embodiment of the present disclosure for solving such a problem will be described later in detail with reference to FIGS. 10 to 22 below.

Figure 10:
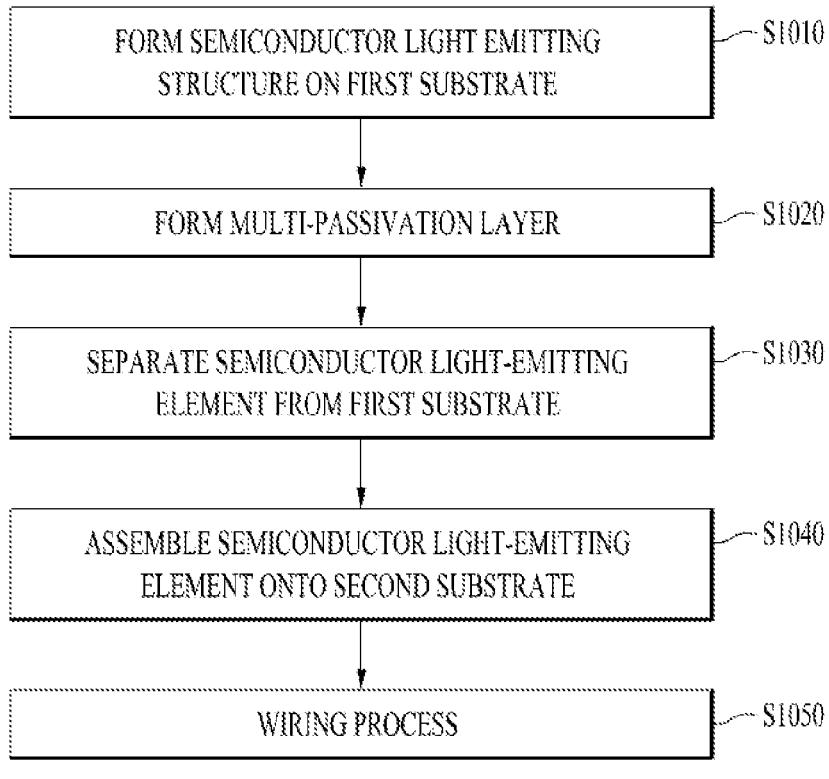
FIG. 10 is a flowchart illustrating a method for manufacturing a display device using a semiconductor light-emitting element according to another embodiment of the present disclosure.

FIG. 10 is a flowchart illustrating a method for manufacturing a display device using a semiconductor light-emitting element according to another embodiment of the present disclosure.

First, a semiconductor light emitting structure is formed on a first substrate (or the growing substrate) (S1010). In the present disclosure, the semiconductor light emitting structure may be both a horizontal type semiconductor light emitting structure and a vertical type semiconductor light emitting structure, but it will be described in a following description that the horizontal type semiconductor light emitting structure is formed. Hereinafter, a detailed forming method will be described later with reference to FIG. 13.

Thereafter, a multi-passivation layer is formed for the semiconductor light emitting structure formed on the first substrate (S1020). The multi-passivation layer is composed of a first passivation layer and a second passivation layer, and a partial region of the first passivation layer formed on the semiconductor light emitting structure is removed before forming the second passivation layer. In a following description of the present specification, the semiconductor light-emitting structure on which the multi-passivation layer is formed will be defined and described as the semiconductor light-emitting element.

Next, the semiconductor light-emitting element formed on the first substrate is separated from the first substrate (S1030).

Methods for separating the semiconductor light-emitting element from the first substrate are largely divided into, for example, two. The first is that the semiconductor light-emitting element of the first substrate is directly transferred to a second substrate and separated. In this case, because it is a substrate-to-substrate transfer, a distance between the semiconductor light-emitting elements after the transfer is the same as that on the first substrate. However, for example, the arrangement error of the semiconductor light-emitting elements may occur during the transfer process by a flexible film used for the transfer between the substrates.

The second is that the semiconductor light-emitting element is individually separated from the first substrate and exists as an individual semiconductor light-emitting element.

Then, the separated semiconductor light-emitting element is assembled onto the second substrate (S1040).

The assembly refers to a process of moving the semiconductor light-emitting element from the first substrate to the second substrate, which may be used interchangeably with the transfer. As described above, in the case of the substrate-to-substrate transfer, the second substrate may be a donor substrate for another transfer or a wiring substrate having wirings to be utilized directly as the display panel.

The transfer process is a process of moving the semiconductor light emitting element of the first substrate to the second substrate as if stamping a seal using an adhesive film or the like. Such process is referred, for example, to as a stamp process.

The stamp process may include an alignment operation. For example, the stamp process is performed by moving one of the first substrate and the second substrate horizontally and then vertically with respect to the other. Thereafter, whether an assembly position of the semiconductor light-emitting element of the first substrate and an assembly position of the second substrate corresponding to the semiconductor light-emitting element are overlapped is inspected by a camera sensor or the like, and when the assembly positions overlap, the semiconductor light-emitting element is assembled based on the position. However, even in this case, a little arrangement error may exist.

During the transfer process, the anisotropic conductive film may be used as the adhesive film to achieve conductivity between the substrate and the semiconductor light emitting element.

In order to selectively transfer only some of the semiconductor light-emitting elements grown on the first substrate, a method such as laser lift-off (LLO) that selectively separates the element by applying a laser to a surface of the substrate opposite to a surface on which the element is grown may be used.

As another method for assembling the semiconductor light-emitting element onto the second substrate, for example, a self-assembly process may be performed.

The self-assembly process refers to a process in which a very large number of semiconductor light-emitting elements are assembled onto the second substrate by a force of an electromagnetic field in a chamber filled with a fluid.

The second substrate may be an assembly substrate in which an assembly groove for self-assembly of the semiconductor light-emitting element is defined. An assembly electrode may be disposed at a lower portion of the assembly groove, and the assembly substrate may be located in the chamber filled with the fluid.

The semiconductor light-emitting element floating in the fluid includes, for example, a magnetic layer, so that the semiconductor light-emitting element may move in a direction of the assembly substrate by an assembly apparatus having a magnetic body acting above the assembly substrate. That is, the semiconductor light-emitting element in the chamber may move toward the assembly apparatus by a magnetic field generated by the assembly apparatus.

The assembly substrate with the assembly groove defined therein may be located in the direction of moving toward the assembly apparatus, and the semiconductor light-emitting element may be in contact with the assembly groove.

In this case, the semiconductor light-emitting element in contact with the assembly groove is fixed by an electric field applied from the assembly electrode formed at the lower portion of the assembly groove.

Using the self-assembly scheme using the electric and magnetic fields, a time required for assembling the semiconductor light-emitting elements onto the substrate may be drastically reduced.

However, there is an assembly gap between the assembly groove and the semiconductor light-emitting element to be assembled. Among the assembly gaps, an assembly gap having a value equal to or greater than a predetermined reference value may cause poor electrode formation during the wiring process.

Thereafter, the wiring process is performed for the semiconductor light-emitting element assembled onto the second substrate (S1050). The wiring process includes a process of forming an insulating layer, a process of planarizing the insulating layer, and an etching process for forming the electrode.

However, in view of the entire gist of the present specification, deleting and changing some operations of the flowchart shown in FIG. 10 at an understandable level of those skilled in the art also fall within another scope of the present disclosure.

Figure 11:
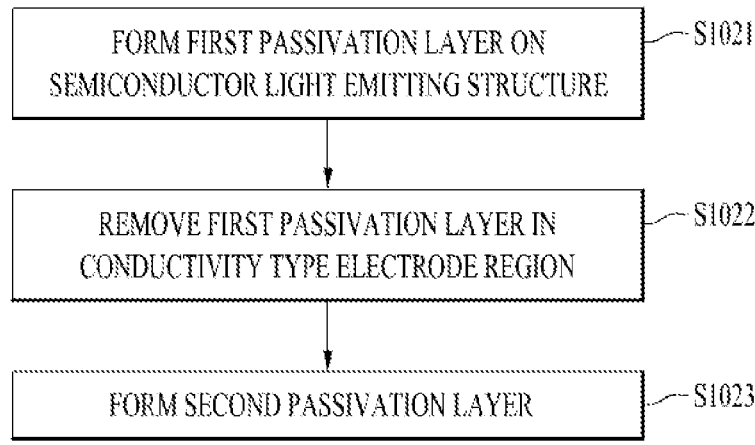
FIG. 11 is a flowchart specifically illustrating a process of forming a multi-passivation layer of FIG. 10.

FIG. 11 is a flowchart specifically illustrating a process of forming a multi-passivation layer of FIG. 10.

Because the passivation layer is formed continuously after forming the semiconductor light emitting structure on the first substrate, the passivation layer may not be formed on a bottom surface of the semiconductor light emitting structure. However, this is only an exemplary case, and the present disclosure is not limited thereto.

In addition, the passivation layer may be formed through plasma enhanced chemical vapor deposition (PECVD), low pressure chemical vapor deposition (LPCVD), sputtering deposition, or the like of an inorganic insulator, such as silica, alumina, or the like, or through a method for spin coating of an organic material such as a photoresist or a polymer material.

First, the first passivation layer is formed on the semiconductor light emitting structure formed on the first substrate (S1021). As will be described later, the semiconductor light emitting structure includes a first conductivity type semiconductor layer, an active layer, a second conductivity type semiconductor layer, a first conductivity type electrode, and a second conductivity type electrode.

The first passivation layer is formed on all of side surfaces and a top surface of the semiconductor light emitting structure, and a first conductivity type electrode formed on a first conductivity type semiconductor layer and a first conductivity type electrode formed on a second conductivity type semiconductor layer are positioned on top of the semiconductor light emitting structure.

Thereafter, a process of selectively removing the first passivation layer formed on the first conductivity type electrode and the second conductivity type electrode positioned on top of the semiconductor light emitting structure is performed (S1022).

The selective removal process (S1022) may include a photo-lithography process and an etching process.

The etching process refers to, for example, wet etching or dry etching.

After the selective removal process, the first passivation layer is located in a region excluding the first conductivity type electrode and the second conductivity type electrode on the side surfaces and the top surface of the semiconductor light emitting structure.

Thereafter, the second passivation layer is formed on the semiconductor light emitting structure (S1023).

Accordingly, the first passivation layer and the second passivation layer are sequentially disposed on the side surfaces of the semiconductor light emitting structure. In addition, in regions of the top surface of the semiconductor light emitting structure, only the second passivation layer is formed on top of the first conductivity type electrode and the second conductivity type electrode, and the first passivation layer and the second passivation layer are sequentially disposed in a region excluding the first conductivity type electrode and the second conductivity type electrode.

In one example, when the first passivation layer and the second passivation layer are made of different materials, for example, a first etching ratio of the first passivation layer may be smaller than a second etching ratio of the second passivation layer.

The etching ratio is a ratio indicating a degree of etching for a unit time. The etching ratio may vary depending on a reacting chemical solution in a case of the wet etching, and may vary depending on a type of a reacting ion gas in a case of the dry etching. In the present disclosure, it means a case in which the first etching ratio of the first passivation layer is smaller than the second etching ratio of the second passivation layer corresponding to the etching scheme being performed.

In addition, when the first passivation layer and the second passivation layer are of the same material, for example, a second thickness of the second passivation layer may be smaller than a first thickness of the first passivation layer.

A difference in the etching ratio or the thickness between the first passivation layer and the second passivation layer provides an environment in which only portions of the passivation layer formed on top of the first conductivity type electrode and the second conductivity type electrode are selectively removed from the semiconductor light-emitting element. Details thereof will be described later with reference to FIGS. 17 to 20.

In addition, the materials of the first passivation layer and the second passivation layer may be differently selected such that a first refractive index of the first passivation layer and a second refractive index of the second passivation layer are different.

Accordingly, when the semiconductor light-emitting element is driven, light emitted from the side surfaces of the element may be reflected back into the element by the multi-passivation layer having different refractive indices to increase luminous efficiency.

In one example, in view of the entire gist of the present specification, deleting and changing some operations of the flowchart shown in FIG. 11 at an understandable level of those skilled in the art also fall within another scope of the present disclosure.

Figure 12:
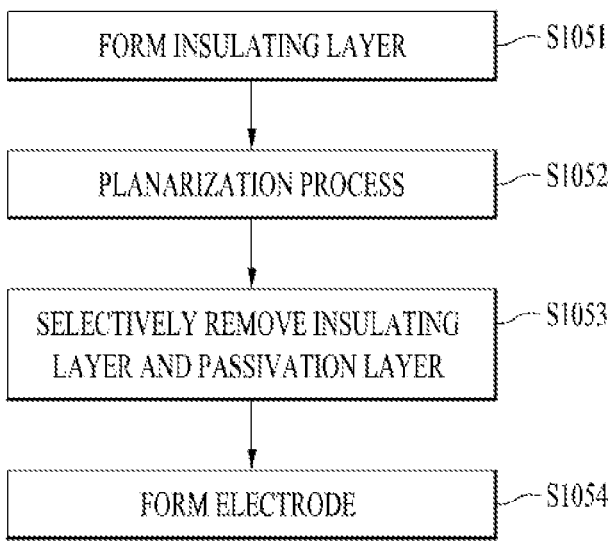
FIG. 12 is a flowchart specifically illustrating a process of performing a wiring process of FIG. 10.

FIG. 12 is a flowchart specifically illustrating a process of performing a wiring process of FIG. 10.

First, the insulating layer is formed on the semiconductor light-emitting element assembled onto the second substrate (S1051). The insulating layer covers the side surfaces and the top surface of the semiconductor light-emitting element. In one example, the insulating layer may be deposited by, for example, a method such as chemical vapor deposition (CVD), and may be coated by the spin coating method after applying an insulating solution onto the substrate.

In addition, the insulating layer may be an organic insulating layer, and, preferably, may be a photosensitive organic insulating layer. The photosensitive organic insulating layer may be formed by applying a photosensitive agent of a positive tone such as a photosensitive acrylate, a photo active compound (PAC), and the like in a spray scheme or by spin coating of the agent. The photosensitive agent of the positive tone refers to a photosensitive agent having a region exposed to light that is developed and removed.

In addition, there is a possibility that the insulating layer formed on top of the semiconductor light-emitting element relatively protrudes, so that a planarization process may be additionally performed on the insulating layer (S1052). The planarization process may refer to, for example, chemical mechanical polishing (CMP), and may perform chemical and mechanical polishing operations.

Thereafter, in order to form a wiring electrode, the insulating layer and the passivation layer formed outwardly of the semiconductor light-emitting element are selectively removed (S1053). The removal of the passivation layer may include removal of both the first passivation layer and the second passivation layer formed on top of the semiconductor light-emitting element, or selective removal of only the second passivation layer. However, even after the removal process, the passivation layer in contact with the insulating layer on the side surfaces of the semiconductor light-emitting element still remains.

When only the second passivation layer is removed, only the first conductivity type electrode and the second conductivity type electrode of the semiconductor light-emitting element are exposed to the outside. As the removal operation, the photo-lithography process and the etching process may be performed.

Thereafter, the first electrode electrically connected to the exposed first conductivity type electrode and the second electrode electrically connected to the exposed second conductivity type electrode are formed (S1054).

The passivation layer is still located in other regions of the semiconductor light-emitting element except for the exposed region. Thus, even when the positions where the first electrode and the second electrode are formed are not accurate, and only some regions are in contact with the conductivity type electrode of the semiconductor light-emitting element, a short between the different semiconductor layers in the semiconductor light-emitting element does not occur.

In one example, in view of the entire gist of the present specification, deleting and changing some operations of the flowchart shown in FIG. 12 at an understandable level of those skilled in the art also fall within another scope of the present disclosure.

Figure 13:
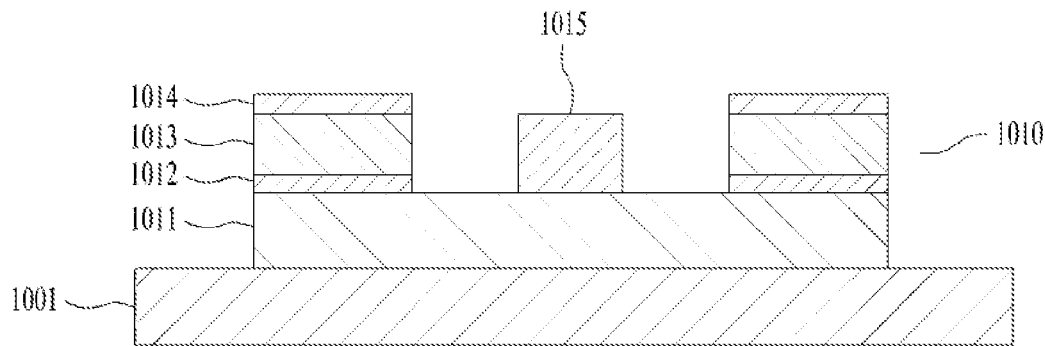
FIG. 13 is a cross-sectional view showing a semiconductor light emitting structure formed on a first substrate of FIG. 10.

FIG. 13 is a cross-sectional view showing a semiconductor light emitting structure formed on a first substrate of FIG. 10.

As shown in FIG. 13, a semiconductor light emitting structure 1010 is formed on a first substrate 1001, and includes a first conductivity type semiconductor layer 1011, an active layer 1012, a second conductivity type semiconductor layer 1013, a first conductivity type electrode 1015, and a second conductivity type electrode 1014. The semiconductor light emitting structure has a horizontal structure. Although a structure in which the first conductivity type electrode 1015 is formed in a region where the first conductivity type semiconductor layer 1011 is exposed as a portion of the second conductivity type semiconductor layer 1013 and a portion of the active layer 1012 are etched is exemplified, the present disclosure may not be limited thereto, and various horizontal mesa structures and vertical structures may be formed.

The first substrate 1001 may be formed to contain a material having a light-transmitting property, for example, one of sapphire (Al2O3), GaN, ZnO, and AlO.

In addition, the first substrate 1001 may be formed of a material suitable for semiconductor material growth, a carrier wafer. The first substrate 1001 may be formed of a material having excellent thermal conductivity. Including a conductive substrate or an insulating substrate, for example, a SiC substrate having higher thermal conductivity compared to a sapphire (Al2O3) substrate or at least one of Si, GaAs, GaP, InP, and Ga2O3 may be used for the first substrate 1001, but the present disclosure may not be limited thereto.

Further, the first conductivity type semiconductor layer 1011 grown on the first substrate 1001, which is an n-type semiconductor layer, may be a nitride semiconductor layer such as n-GaN, and the second conductivity type semiconductor layer 1013 may be a p-type semiconductor layer. However, the present disclosure is not necessarily limited thereto. The first conductivity type semiconductor layer 1011 may be of the p-type and the second conductivity type semiconductor layer 1013 may be of n-type.

Further, according to another embodiment of the present disclosure, the first conductivity type semiconductor layer 1011 and the second conductivity type semiconductor layer 1013 may be formed by implanting impurities into an intrinsic or doped semiconductor substrate. In addition, a region in which a p-n junction is formed by the impurity implantation may serve as the active layer 1012. The list detail of the first conductivity type semiconductor layer 1011, the second conductivity type semiconductor layer 1013, and the active layer 1012 are exemplary only, and the present disclosure is not limited thereto.

In addition, as shown in FIG. 13, the first conductivity type electrode 1015 is formed on top of the first conductivity type semiconductor layer. Therefore, in order to form the first conductivity type electrode 1015, a process of patterning a partial region of the stacked semiconductor layer through the photo process, etching the corresponding region, and then depositing a conductivity type electrode may be performed.

The first conductivity type electrode 1015 may be in electrical contact with the first conductivity type semiconductor layer 1011 and may be formed of at least one metal layer. The first conductivity type electrode 1015 may contain at least one of ITO, chromium (Cr), titanium (Ti), and nickel-silver (Ni—Ag) to form an ohmic contact layer having an ohmic contact characteristic with the first conductivity type semiconductor layer 1011.

In addition, the second conductivity type electrode 1014 formed on the second conductivity type semiconductor layer 1013 may be formed of at least one metal layer like the first conductivity type electrode 1015. The second conductivity type electrode 1014 may contain at least one of ITO, chromium (Cr), titanium (Ti), and nickel-silver (Ni—Ag) to form an ohmic contact layer having an ohmic contact characteristic with the second conductivity type semiconductor layer 1013.

In addition, for the semiconductor light-emitting element for the self-assembly, a magnetic layer may be formed beneath the first conductivity type electrode 1015 or the second conductivity type electrode 1014. Alternatively, for example, the magnetic layer itself formed on top of the first conductivity type semiconductor layer 1011 or the second conductivity type semiconductor layer 1013 may be used as the conductivity type electrode.

Figure 14:
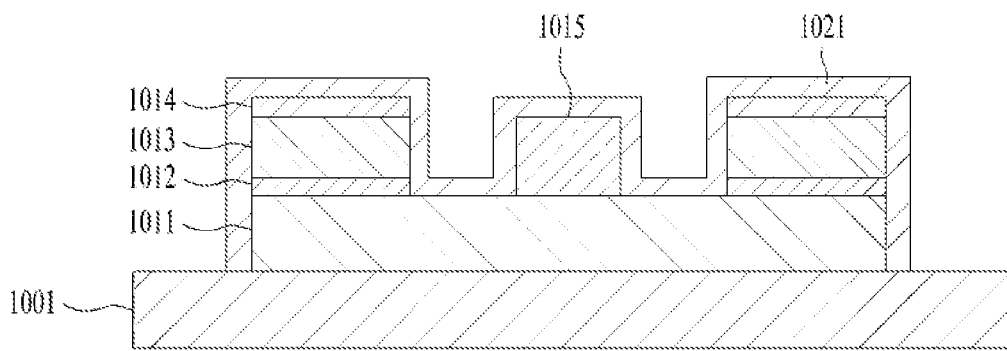
FIG. 14 is a cross-sectional view after a first passivation layer is formed on a semiconductor light emitting structure of FIG. 13.

FIG. 14 is a cross-sectional view after a first passivation layer is formed on a semiconductor light emitting structure of FIG. 13.

As shown in FIG. 14, a first passivation layer 1021 is formed on the side surfaces and the top surface of the semiconductor light emitting structure. The semiconductor light emitting structure is formed on the first substrate 1001, and the first passivation layer 1021 is also continuously formed, so that the first passivation layer 1021 may not be formed on the bottom surface of the semiconductor light emitting structure. However, this is only an example, and the present disclosure is not limited thereto.

Specifically, in FIG. 14, both side surfaces of each of the active layer 1012 and the second conductivity type semiconductor layer 1013 of the semiconductor light emitting structure are in contact with the first passivation layer 1021, and both side surfaces and a top surface of each of the first conductivity type semiconductor layer 1011, the first conductivity type electrode 1015, and the second conductivity type electrode 1014 of the semiconductor light emitting structure are in contact with the first passivation layer 1021. However, this is only an example, and the present disclosure is not limited thereto.

Figure 15:
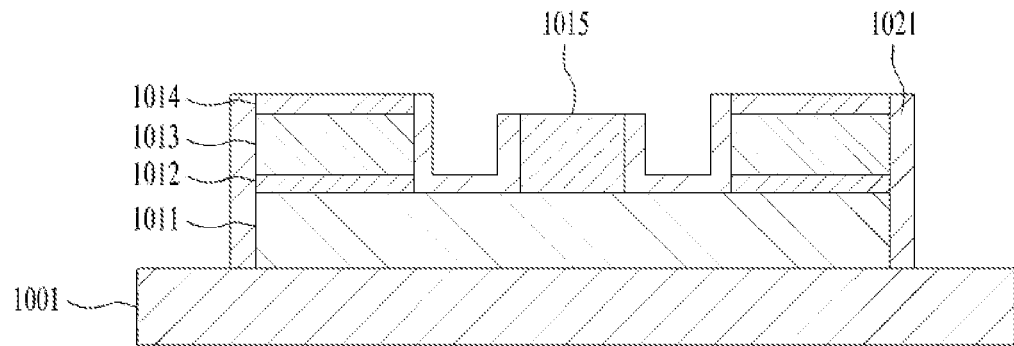
FIG. 15 is a cross-sectional view of a semiconductor light emitting structure of FIG. 14 after selectively removing only portions of a first passivation layer formed on top of conductivity type electrodes.

FIG. 15 is a cross-sectional view of a semiconductor light emitting structure of FIG. 14 after selectively removing only portions of a first passivation layer formed on top of conductivity type electrodes.

For the selective removal, a process of patterning some regions of the top surface of the semiconductor light-emitting element through the photo process and etching the corresponding regions may be performed.

As shown in FIG. 15, in the semiconductor light emitting structure formed on the first substrate 1001, regions in which the first passivation layer 1021 is formed are the side surfaces of each of the first conductivity type semiconductor layer 1011, the active layer 1012, the second conductivity type semiconductor layer 1013, the first conductivity type electrode 1015, and the second conductivity type electrode 1014, and some regions on the top surface of the first conductivity type semiconductor layer 1011. That is, the first passivation layer 1021 is removed and does not exist only on top of the conductivity type electrodes for electrically connecting the semiconductor light emitting structure.

Figure 16:
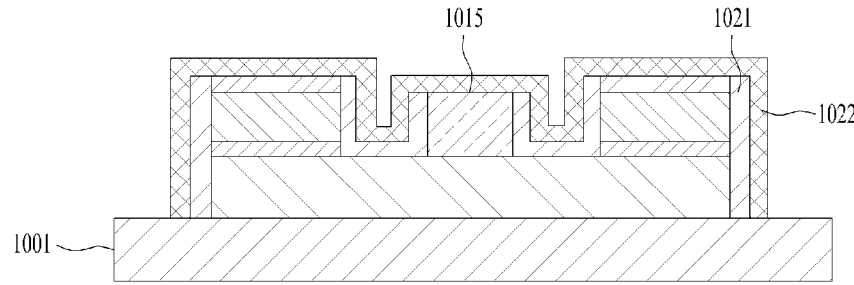
FIG. 16 is a cross-sectional view of a semiconductor light-emitting element in which a second passivation layer is formed on a semiconductor light emitting structure of FIG. 15.

FIG. 16 is a cross-sectional view of a semiconductor light-emitting element in which a second passivation layer is formed on a semiconductor light emitting structure of FIG. 15.

A second passivation layer 1022 is sequentially formed outwardly of the first passivation layer 1021 formed in advance on the semiconductor light emitting structure, and additionally formed on top of the first conductivity type electrode 1015 and the second conductivity type electrode 1014.

Therefore, only the second passivation layer 1022 is formed on top of the first conductivity type electrode 1015 and the second conductivity type electrode 1014, and the first passivation layer 1021 and the second passivation layer 1022 are sequentially disposed on surfaces other than the bottom surface of the semiconductor light emitting structure.

Figure 17:
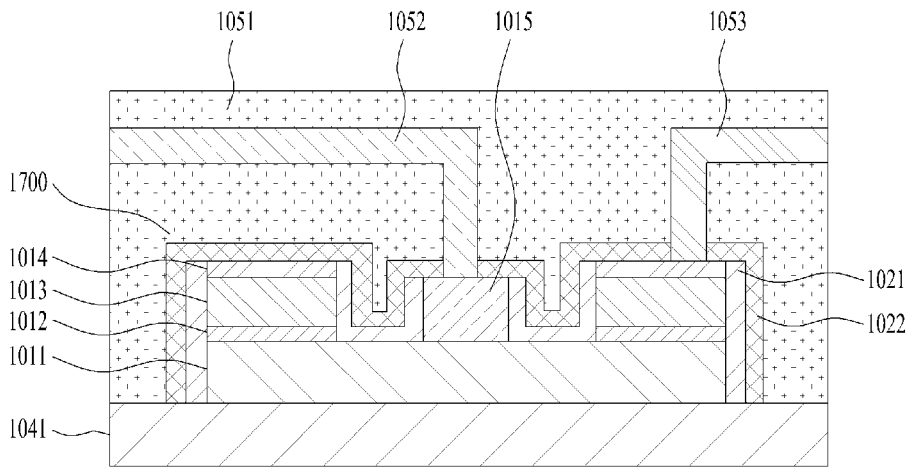
FIG. 17 is a cross-sectional view of a semiconductor light-emitting element of FIG. 16 after a wiring process is performed.

FIG. 17 is a cross-sectional view of a semiconductor light-emitting element of FIG. 16 after a wiring process is performed.

In order to perform the wiring process, the process in which the semiconductor light-emitting element, which is the semiconductor light-emitting structure with the multi-passivation layer, is separated from the first substrate and assembled onto the second substrate should be preceded. As described above, the separation and assembly operation may be performed by the substrate-to-substrate transfer method or the self-assembly method.

As shown in FIG. 17, a semiconductor light-emitting element 1700 including the first conductivity type semiconductor layer 1011, the active layer 1012, the second conductivity type semiconductor layer 1013, the first conductivity type electrode 1015, the second conductivity type electrode 1014, the first passivation layer 1021, and the second passivation layer 1022 is located on a second substrate 1041.

A first electrode 1052 and a second electrode 1053 are respectively located in partial regions of the top surfaces of the first conductivity type electrode 1015 and the second conductivity type electrode 1014 of the semiconductor light-emitting element, and an insulating layer 1051 is formed on the top surface and the side surfaces of the element such that the electrodes are not electrically connected to other regions of the semiconductor light-emitting element.

In addition, FIG. 17, which is a cross-sectional view of the semiconductor light-emitting element after the wiring process described above in FIG. 12 is performed, is a view of the semiconductor light-emitting element subjected to the planarization process and the electrode formation after the insulating layer is formed thereon.

A thickness of the insulating layer 1051 is sufficiently greater than a height of the assembled semiconductor light-emitting element 1700 such that an upper portion of the semiconductor light-emitting element 1700 is not exposed on the surface. Thereafter, in order to expose certain regions of the top surfaces of the first conductivity type electrode 1015 and the second conductivity type electrode 1014, the photo process and the etching process are performed on the corresponding regions.

The first electrode 1052 and the second electrode 1053 for the electrical connection with the first conductivity type electrode 1015 and the second conductivity type electrode 1014 are formed in the exposed regions. Thereafter, the insulating layer 1051 is applied again to protect the electrodes 1052 and 1053. Accordingly, the insulating layer 1051 shown in FIG. 17 may be composed of a first insulating layer before the electrode forming process and a second insulating layer for protecting the corresponding electrodes after the electrode formation in a strict sense.

In addition, the etching process may be the dry etching or the wet etching. In the case of the dry etching, for example, anisotropic etching is mainly performed using an ionic reactive gas in a plasma state, so that fine patterns and precise control of a thickness to be etched are possible. In addition, in the case of the wet etching, using a chemical solution, a region in contact with the chemical solution is mainly subjected to isotropic etching.

The semiconductor light-emitting element 1700 of FIG. 17 shows that the first electrode 1052 and the second electrode 1053 are accurately connected to the first conductivity type electrode 1015 and the second conductivity type electrode 1014, respectively.

In the case of the semiconductor light-emitting element 1700, even when the electrodes 1052 and 1053 are formed at positions spaced apart from each other by an error distance due to the arrangement error during the assembly, a probability of occurrence of a defect such as a short is reduced.

The short defect refers to, for example, a phenomenon in which, when the first electrode is formed in the semiconductor light-emitting element, not only the corresponding first conductivity type electrode, but also other unintended regions such as the second conductivity type semiconductor layer of the semiconductor light-emitting element are electrically connected.

A main cause of the decrease in the occurrence probability of the short defect in the present disclosure is that, as described above in FIG. 11, primarily, the multi-passivation layer is formed in the structure of the semiconductor light-emitting element, and secondarily, the etching ratios of the passivation layers are selected differently or the thicknesses of the passivation layers are different.

For example, in order to expose the partial region of the first conductivity type electrode 1015 of the semiconductor light-emitting element 1700, an etching process for selectively removing the second passivation layer 1022 surrounding the conductivity type electrode is performed. Assuming that the etching process is performed at a position overlapping the first conductivity type electrode 1015 and the second conductivity type semiconductor layer 1011, and the first passivation layer 1021 is not present, the region of the second conductivity type semiconductor layer 1011 will be exposed by the etching process. Accordingly, there is a high probability that the short defect occurs between the first conductivity type semiconductor layer 1011 and the second conductivity type semiconductor layer 1013 during the electrode formation.

In addition, even in a structure in which the first passivation layer 1021 exists, for example, when the first passivation layer 1021 is of the same material with the same etching ratio as the material of the second passivation layer 1022, and has a very small thickness, the first passivation layer 1021 will be removed together with the second passivation layer during the etching process, which may cause the short defect during the electrode formation.

A structure for preventing such short defect is very important for the display device that requires the transfer or the assembly of the semiconductor light-emitting element. The reason is that the arrangement error inevitably occurs during the transfer or the assembly, and the arrangement error gradually increases the probability of causing the short defect during the electrode formation in an environment in which a semiconductor light-emitting elements of a smaller size is gradually required for the high-pixel display. Therefore, the structure of the conventional semiconductor light-emitting element is not suitable, and the semiconductor light-emitting element structure capable of selectively removing only the portions of the passivation layer formed in the electrically connected conductivity type electrode regions is required. Therefore, the present disclosure may be viewed as an embodiment of the semiconductor light-emitting element structure that satisfies the above requirement.

Figure 18:
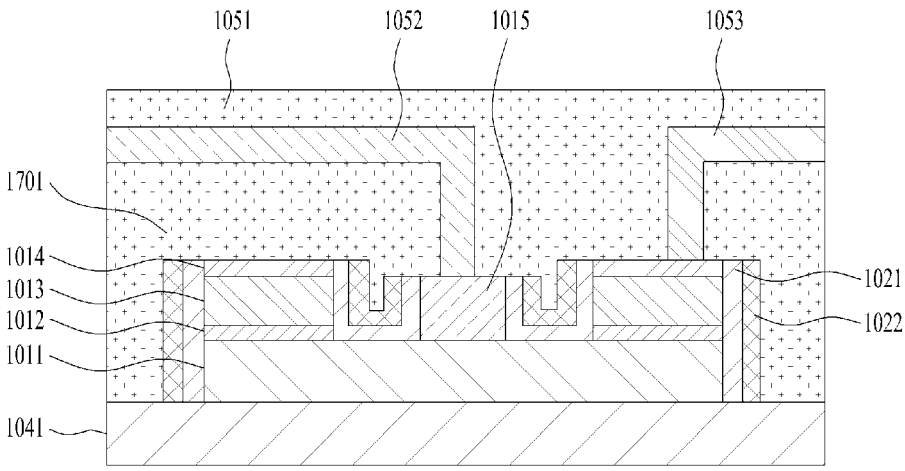
FIG. 18 is a cross-sectional view of a semiconductor light-emitting element of FIG. 16 after a wiring process is performed.

FIG. 18 is another cross-sectional view of a semiconductor light-emitting element of FIG. 16 after a wiring process is performed.

The wiring process is different from the wiring process of FIG. 17 in terms of a thickness of the first insulating layer to be formed. In the wiring process of FIG. 17, the insulating layer thick enough to completely cover the upper portion of the semiconductor light-emitting element was formed. On the other hand, in the wiring process of FIG. 18, the first insulating layer (not shown) having a thickness similar to a height of an upper portion of an assembled semiconductor light-emitting element 1701 is formed. Thereafter, the first insulating layer is planarized, so that the semiconductor light-emitting element 1701 is exposed to the surface. In addition, the etching process for removing the portions of the second passivation layer formed on the conductivity type electrodes 1014 and 1015 of the exposed semiconductor light-emitting element 1701 is performed. In this connection, the etching process may be performed on the entire substrate without the separate photo process.

Thereafter, the second insulating layer is formed again, and the electrodes 1052 and 1053 electrically connected to the respective conductivity type electrodes 1014 and 1015 are formed. In addition, a third insulating layer for protecting the electrodes 1052 and 1053 is additionally formed.

As shown in FIG. 18, the semiconductor light-emitting element 1701 after the wiring process includes the first conductivity type semiconductor layer 1011, the active layer 1012, the second conductivity type semiconductor layer 1013, the first conductivity type electrode 1015, the second conductivity type electrode 1014, the first passivation layer 1021, and the second passivation layer 1022, and is located on the second substrate 1041.

In addition, the first passivation layer 1021 and the second passivation layer 1022 are not present on top of the first conductivity type electrode 1015 and the second conductivity type electrode 1014 of the semiconductor light-emitting element 1701.

In addition, the first electrode 1052 and the second electrode 1053 are respectively located in the partial regions of the top surfaces of the first conductivity type electrode 1015 and the second conductivity type electrode 1014 of the semiconductor light-emitting element 1701, and the insulating layer 1051 is formed on the top surface and the side surfaces of the element such that the electrodes are not electrically connected to other regions of the semiconductor light-emitting element. The insulating layer 1051 is a concept including the first insulating layer, the second insulating layer, and the third insulating layer described above in the wiring process of FIG. 18.

A difference of the semiconductor light-emitting element of FIG. 18 from the semiconductor light-emitting element of FIG. 17 is removed regions of the second passivation layer formed on the conductivity type electrodes. In the semiconductor light-emitting element of FIG. 18, portions of the second passivation layer formed on the conductivity type electrodes are completely removed. On the other hand, in the semiconductor light-emitting element of FIG. 17, the portions of the second passivation layer formed on the conductivity type electrodes are partially removed.

In the case of the wiring process of FIG. 18, the upper region of the semiconductor light-emitting element is exposed to the surface by the planarized first insulating layer, so that the etching process may be collectively performed without the photo process on the upper regions of the plurality of semiconductor light-emitting elements assembled onto the substrate. The etching process may be either the dry etching or the wet etching, but the wet etching is more preferable. In the case of the wet etching, low-cost and high-speed etching is possible compared to the dry etching. The process may be performed simply using a chemical solution that selectively etches the second passivation layer.

In addition, after selectively etching the second passivation layer, the second insulating layer is formed again, and the additional etching process is performed for the electrode formation. In this connection, the additional etching process performs only the etching on the insulating layer, which is not the passivation layer, and contains the organic material as a main component, so that high-speed etching is possible, and control of the etching thickness is easy.

Figure 19:
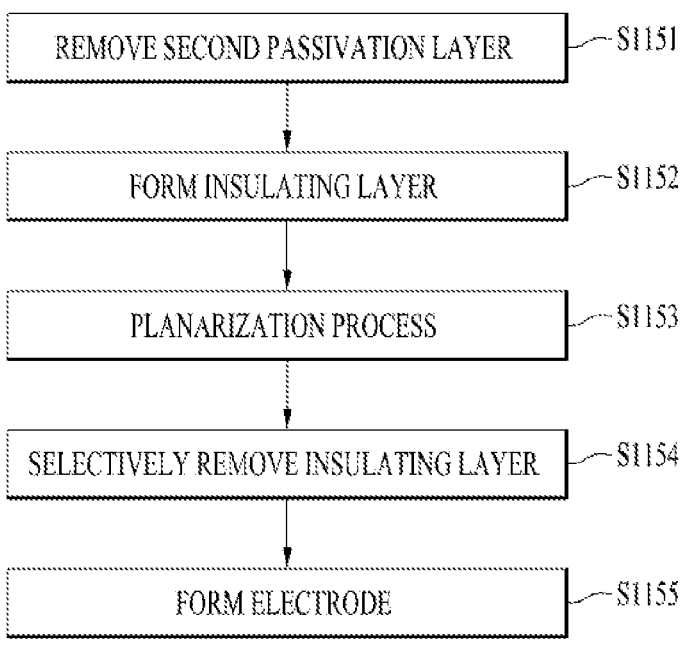
FIG. 19 is a flowchart specifically illustrating another wiring process method performed on a semiconductor light-emitting element of FIG. 16.

FIG. 19 is a flowchart specifically illustrating another wiring process method performed on a semiconductor light-emitting element of FIG. 16.

The additional wiring process refers to a case in which the etching process is performed first, not the insulating layer is first formed on the semiconductor light-emitting element assembled onto the second substrate.

As shown in FIG. 19, first, the second passivation layer formed on the semiconductor light-emitting element assembled onto the second substrate is removed (S1151). In this connection, because an entirety of the second passivation layer is exposed to the outside, the entirety of the second passivation layer will be removed. Thereafter, the insulating layer is formed on the side surfaces and the top surface of the semiconductor light-emitting element from which the second passivation layer has been removed (S1152), and then the planarization process is performed (S1153). In addition, a partial region of the planarized insulating layer is selectively removed such that the partial region of the conductivity type electrode of the semiconductor light-emitting element is exposed (S1154). Finally, the electrode is formed by depositing a conductive material such as a metal on the exposed region (S1155).

In one example, in view of the entire gist of the present specification, deleting and changing some operations of the flowchart shown in FIG. 19 at an understandable level of those skilled in the art also fall within another scope of the present disclosure.

Figure 20:
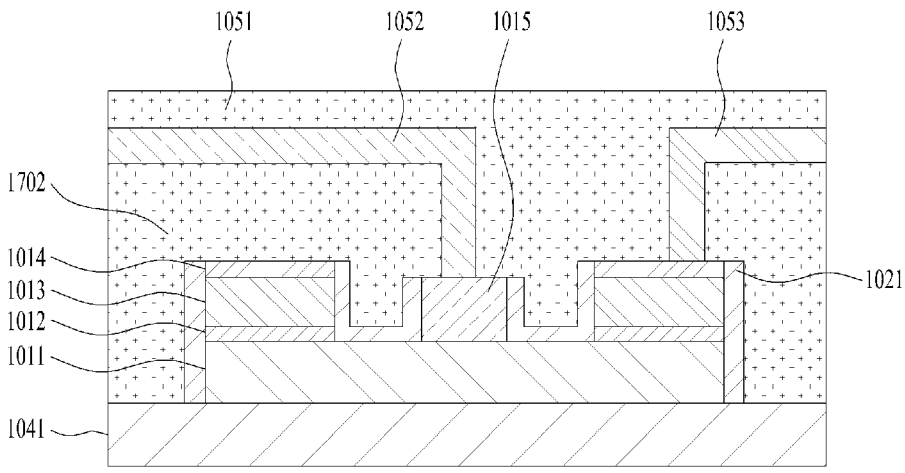
FIG. 20 is a cross-sectional view of a semiconductor light-emitting element on which a wiring process according to FIG. 19 is performed.

FIG. 20 is a cross-sectional view of a semiconductor light-emitting element on which a wiring process according to FIG. 19 is performed.

As shown in FIG. 20, a semiconductor light-emitting element 1702 after the wiring process includes the first conductivity type semiconductor layer 1011, the active layer 1012, the second conductivity type semiconductor layer 1013, the first conductivity type electrode 1015, the second conductivity type electrode 1014, and the first passivation layer 1021, and is located on the second substrate 1041.

In addition, the first passivation layer 1021 and the second passivation layer 1022 are not present on top of the first conductivity type electrode 1015 and the second conductivity type electrode 1014 of the semiconductor light-emitting element 1702.

In addition, the first electrode 1052 and the second electrode 1053 are respectively located in the partial regions of the top surfaces of the first conductivity type electrode 1015 and the second conductivity type electrode 1014 of the semiconductor light-emitting element 1701, and the insulating layer 1051 is positioned on the top surface and the side surfaces of the element such that the electrodes are not electrically connected to other regions of the semiconductor light-emitting element.

The semiconductor light-emitting element 1702 shown in FIG. 20 may be, for example, the semiconductor light-emitting element assembled by the self-assembly process. In the case of the semiconductor light-emitting element for the self-assembly, it is essential to form the passivation layer on top of the element at a time when the element is assembled for protecting the element in the fluid. However, after the self-assembly, the semiconductor light-emitting element assembled onto the substrate is subjected to the etching process such that the conductivity type electrode at the upper portion of the element is exposed for the electrical connection. In this process, when the semiconductor light-emitting element is self-assembled with a large arrangement error, the conductivity type electrode is not etched at the correct position in the etching process, resulting in the short defect. For example, when the semiconductor light-emitting element is protected with the single passivation layer, the short defect between the first conductivity type semiconductor layer and the second conductivity type semiconductor layer may be caused during the subsequent electrode formation when not only the passivation layer formed on top of the second conductivity type electrode, but also the passivation layer formed on top of the first conductivity type semiconductor layer are removed in the etching process for the second electrode formation. In addition, even when the multi-passivation layer is disposed, when the same multi-passivation layer is disposed in the conductivity type electrode region and other regions in the element, similar to the element on which the single passivation layer is formed, the etching at the wrong position may cause the short defect.

Therefore, in order to form the electrode stably even when there is the arrangement error when assembling the semiconductor light-emitting element, the structure of the multi-passivation layer is important to selectively expose only the electrical connection region of the element. That is, only the electrical connection region of the element needs a structure that is relatively easy to be etched under the same conditions.

As shown in FIG. 20, the structure of the semiconductor light-emitting element of the present disclosure may easily expose the conductivity type electrode of the semiconductor light-emitting element even when only the etching process is performed without the separate photo process after the assembly, and may stably form the electrode.

More specifically, when the wet etching process is performed after the semiconductor light-emitting element 1702 is assembled, when the first etching ratio of the first passivation layer 1021 of the semiconductor light-emitting element 1702 is smaller than the second etching ratio of the second passivation layer, even when a predetermined time elapses in the wet etching state exposed to the chemical solution after the second passivation layer is etched, the first passivation layer 1702 remains by the difference in the etching ratio. Accordingly, the regions other than the top surfaces of the first conductivity type electrode 1015 and the second conductivity type electrode 1014 of the semiconductor light-emitting element 1702 are completely protected by the second substrate 1041 and the first passivation layer 1021, so that the stable wiring electrode may be formed.

The structure of the semiconductor light-emitting element 1702 on which the wiring process is completed shown in FIG. 20 is similar to that of the conventional semiconductor light-emitting element, but this is a shape of the result. Those skilled in the art will be able to easily determine the effect of the present disclosure considering the structure of the semiconductor light-emitting element at the time of the assembly onto the second substrate 1041 and the wiring process.

Figure 21:
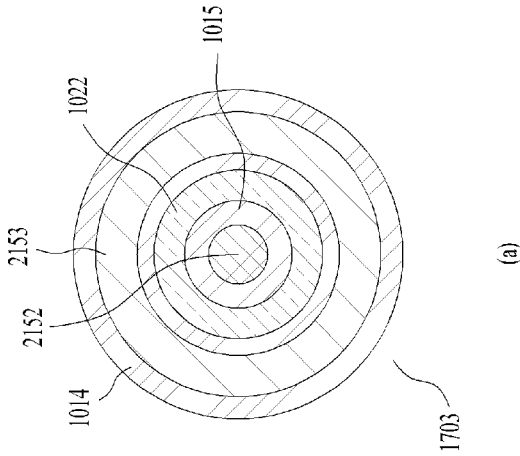
FIG. 21 is a view showing various shapes of electrodes that may be formed by a wiring process.
Figure 21:
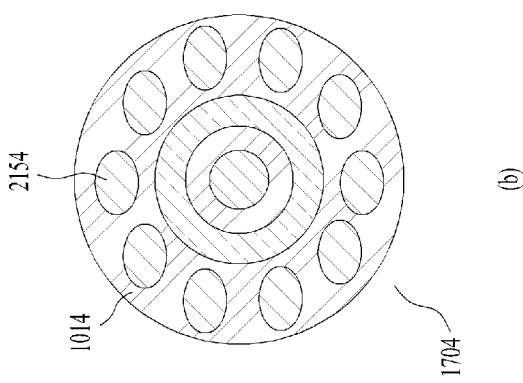
Figure 21:
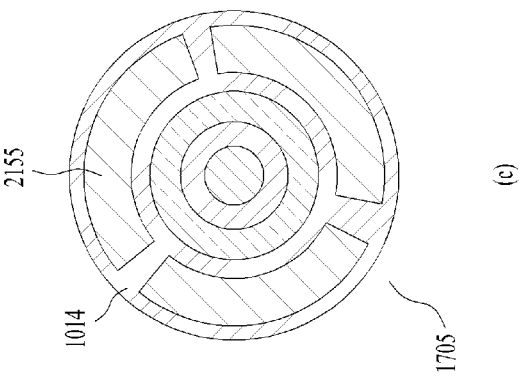

FIG. 21 is a view showing various shapes of electrodes that may be formed by a wiring process.

On the semiconductor light-emitting element on which the wiring process is performed, the first passivation layer and the second passivation layer are formed as described above, and the first etching ratio of the first passivation layer is smaller than the second etching ratio of the second passivation layer.

(a) in FIG. 21 is a plan view of a structure of a semiconductor light-emitting element 1703 in which the second electrode 2153 is formed in a circular band shape, viewed from the top.

The semiconductor light-emitting element 1703 may have a circular horizontal type semiconductor light emitting structure, the first conductivity type electrode 1015 and a first electrode 2152 are located in a central region, and the second passivation layer 1022, the second conductivity type electrode 1014, and a second electrode 153 are located in a direction away from the central region.

Although the first conductivity type electrode 1015 and the second conductivity type electrode 1014 are shown in (a) in FIG. 21 to visually express the formation position of the second electrode 2153, in the actual structure, the first passivation layer and the second passivation layer 1022 are formed on top of the first conductivity type electrode 1015 and the second conductivity type electrode 1014.

In the case of the semiconductor light-emitting element 1703, because a space in which the electrode is to be formed on the top surface of the second conductivity type electrode 1014 is wide, as shown in (a) in FIG. 20, the second electrode 2153 may be formed in the circular band shape on top of the second conductivity type electrode 1014.

(b) in FIG. 21 is a plan view of a structure of a semiconductor light-emitting element 1704 in which a plurality of second electrodes 2154 are formed in a circular shape on top of the second conductivity type electrode 1014, viewed from the top.

(c) in FIG. 21 is a plan view of a structure of a semiconductor light-emitting element 1705 in which a plurality of second electrodes 2155 are formed in a shape of a sector-shaped band on top the second conductivity type electrode 1014, viewed from the top.

In the case of the semiconductor light-emitting element with the multi-passivation layer structure with the different etching ratios, as it is easy to remove a portion of a passivation layer exposed to the outside and having a high etching ratio, various electrodes may be formed as shown in FIG. 21. However, the shapes of the electrodes are merely exemplary, and the present disclosure is not limited thereto.

Figure 22:
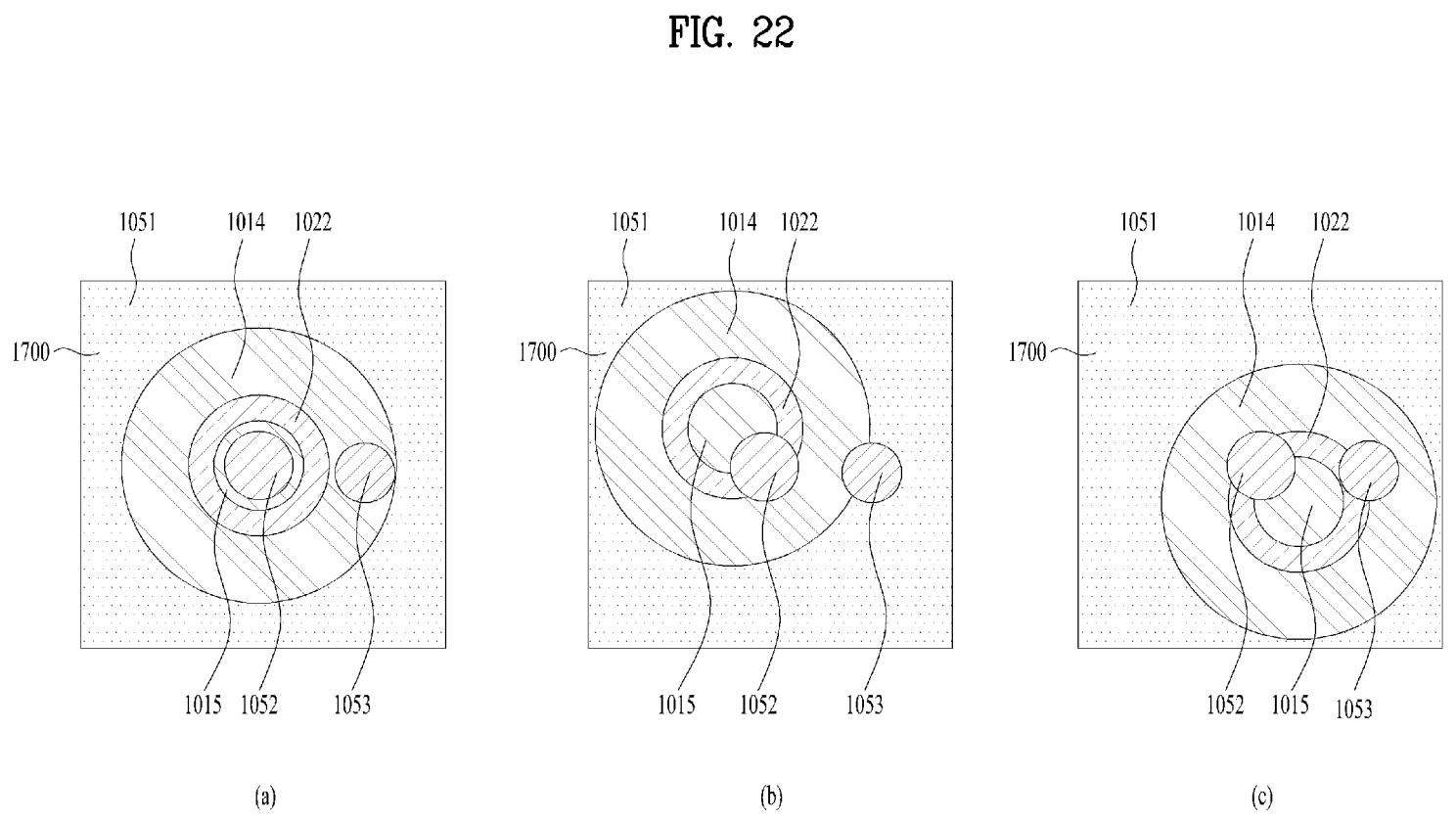

FIG. 22 is a view showing a case in which a wiring electrode is formed at various positions in a semiconductor light-emitting element performing a wiring process of FIG. 17.

As shown in (a) in FIG. 22, the semiconductor light-emitting element 1700 of FIG. 16 is positioned on top of the insulating layer 1051.

The semiconductor light-emitting element 1700 includes the first conductivity type electrode 1015, the second passivation layer 1022, and the second conductivity type electrode 1014.

Although the first conductivity type electrode 1015 and the second conductivity type electrode 1014 are shown in (a) in FIG. 22 to visually express the effect of the present disclosure, in the actual structure, the first passivation layer and the second passivation layer 1022 are formed on top of the first conductivity type electrode 1015 and the second conductivity type electrode 1014.

In addition, a rectangular structure defining an outer periphery of the insulating layer 1051 may be determined as the assembly groove into which the semiconductor light-emitting element 1700 is assembled. Accordingly, (a) in FIG. 22 is a plan view illustrating a shape in which the semiconductor light-emitting element 1700 is assembled at a normal position of the assembly groove.

In one example, when manufacturing the display device, the etching and the wiring process of forming the electrode are performed at once for the plurality of assembled semiconductor light-emitting elements. Thus, the wiring process is performed on the assumption that the semiconductor light-emitting element is assembled at the normal position of the assembly groove.

Therefore, as shown in (a) in FIG. 22, when the semiconductor light-emitting element 1700 is assembled at the normal position, thereafter, the first electrode 1052 and the second electrode 1053 are also precisely positioned on top of the first conductivity type semiconductor layer 1015 and the second conductivity type semiconductor layer 1014.

On the other hand, as shown in (b) in FIG. 22, in a case of the semiconductor light-emitting element 1700 assembled at an upper left end of the assembly groove, when forming the wiring electrode, the first electrode 1052 and the second electrode 1053 may be respectively formed at interfaces of the first conductivity type semiconductor layer 1015 and the second conductivity type semiconductor layer 1014.

In a case of the semiconductor light-emitting element that does not have the multi-passivation layer structure, the first conductivity type electrode 1015 and the second conductivity type electrode 1014 are shorted by the first electrode 1052 formed on the interface as described above, thereby causing the defect.

However, the semiconductor light-emitting element 1700 has the multi-passivation layer structure in which the first passivation layer and the second passivation layer 1022 are formed on top of the first conductivity type electrode 1015 and second conductivity type electrode 1014. Therefore, as the first passivation layer remains even when the second passivation layer 1022 of (b) in FIG. 22 is removed, the short between the first conductivity type electrode 1015 and the second conductivity type electrode 1014 does not easily occur.

In addition, as shown in (c) in FIG. 22, in a case of the semiconductor light-emitting element 1700 assembled at a lower right end of the assembly groove, when forming the wiring electrode, the first electrode 1052 and the second electrode 1053 may be respectively formed at the interfaces of the first conductivity type semiconductor layer 1015 and the second conductivity type semiconductor layer 1014.

The electrodes 1052 and 1053 formed on the interfaces cause the short defect in a general semiconductor element structure.

However, as described above in (b) in FIG. 22, the semiconductor light-emitting element 1700 has the multi-passivation layer structure in which the first passivation layer and the second passivation layer 1022 are formed on top of the first conductivity type electrode 1015 and second conductivity type electrode 1014. Therefore, as the first passivation layer remains even when the second passivation layer 1022 of (c) in FIG. 22 is removed, the short between the first conductivity type electrode 1015 and the second conductivity type electrode 1014 does not easily occur.

As such, in the case of the present disclosure, even when the semiconductor light-emitting element is assembled at a slightly wrong position, the short defect may be prevented in the subsequent wiring process, which is a very important effect in terms of the panel yield.

The above description is merely illustrative of the technical idea of the present disclosure, and various modifications and variations are possible within the scope that does not depart from the essential characteristics of the present disclosure by those with ordinary knowledge in the technical field to which the present disclosure belongs.

Accordingly, the embodiments disclosed in the present disclosure are for description rather than limiting the technical idea of the present disclosure, and the scope of the technical idea of the present disclosure is not limited by such embodiments.

The scope of the present disclosure should be interpreted by the claims below, and all technical ideas within the scope equivalent thereto should be interpreted as being included in the scope of the present disclosure.

What is claimed is:

1. A method for manufacturing a display device using a semiconductor light-emitting element, the method comprising:

forming the semiconductor light-emitting element on a first substrate;

transferring the semiconductor light-emitting element to a second substrate;

coating an insulating layer on the semiconductor light-emitting element transferred to the second substrate; and forming a wiring electrode electrically connected to the semiconductor light-emitting element, wherein the forming of the semiconductor light-emitting element on the first substrate includes:

forming a semiconductor light emitting structure including a first conductivity type semiconductor layer, an active layer, a second conductivity type semiconductor layer, a first conductivity type electrode, and a second conductivity type electrode on the first substrate;

forming a first passivation layer on the semiconductor light emitting structure;

selectively removing portions of the first passivation layer formed on top of the first conductivity type electrode and the second conductivity type electrode of the semiconductor light emitting structure; and forming a second passivation layer on the semiconductor light emitting structure, wherein the method further comprises:

removing the second passivation layer between the transferring of the semiconductor light-emitting element to the second substrate and the coating of the insulating layer.

2. The method of claim 1, wherein the removing of the second passivation layer is performed by a wet etching process.

3. The method of claim 1, wherein the coating of the insulating layer includes:

planarizing an upper portion of the insulating layer.

4. The method of claim 1, wherein the forming of the wiring electrode includes forming a first electrode electrically connected to the first conductivity type electrode of the semiconductor light-emitting element and a second electrode electrically connected to the second conductivity type electrode.

* * * * *